US011327107B2

(12) United States Patent
Park et al.

(10) Patent No.: US 11,327,107 B2
(45) Date of Patent: May 10, 2022

(54) TESTING METHOD OF A SEMICONDUCTOR DEVICE

(71) Applicant: Samsung Electronics Co., Ltd., Suwon-si (KR)

(72) Inventors: Juhun Park, Seoul (KR); Juhyun Kim, Hwaseong-si (KR); Deokhan Bae, Hwaseong-si (KR); Myungyoon Um, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 62 days.

(21) Appl. No.: 17/023,656

(22) Filed: Sep. 17, 2020

(65) Prior Publication Data

US 2021/0231727 A1 Jul. 29, 2021

(30) Foreign Application Priority Data

Jan. 29, 2020 (KR) .................. 10-2020-0010477

(51) Int. Cl.
*G01R 31/26* (2020.01)
*H01L 21/66* (2006.01)

(52) U.S. Cl.
CPC ..... *G01R 31/2644* (2013.01); *G01R 31/2621* (2013.01); *H01L 22/14* (2013.01)

(58) Field of Classification Search
CPC ........... G01R 31/2644; G01R 31/2621; G01R 19/0092; G01R 31/2884; G01R 31/2856; G01R 31/2601; H01L 22/14; H01L 22/34; H01L 22/20

USPC ............... 324/762.03, 762.01, 537, 500
See application file for complete search history.

(56) References Cited

U.S. PATENT DOCUMENTS

| | | | |
|---|---|---|---|
| 6,251,724 B1 | 6/2001 | Ku et al. | |
| 8,138,497 B2 | 3/2012 | Zhu et al. | |
| 8,188,469 B2 | 5/2012 | Lee et al. | |
| 8,787,074 B2 | 7/2014 | Patterson et al. | |
| 8,970,247 B2* | 3/2015 | Oomura | H03K 5/19 |
| | | | 324/762.03 |
| 9,786,571 B1 | 10/2017 | Zhang | |
| 9,941,278 B2 | 4/2018 | Labonte et al. | |
| 2012/0181615 A1 | 7/2012 | Shimizu et al. | |
| 2015/0028914 A1* | 1/2015 | Kim | H01L 21/76898 |
| | | | 324/762.01 |

(Continued)

*Primary Examiner* — Giovanni Astacio-Oquendo
(74) *Attorney, Agent, or Firm* — Myers Bigel, P.A.

(57) ABSTRACT

A method of testing a semiconductor device may include preparing a semiconductor substrate in which the semiconductor substrate includes a test element group including first and second test circuits, measuring first and second leakage currents in the first and second test circuits, respectively, and calculating leakage components by comparing the first and second leakage currents. Each of the first and second test circuits may include an active region, which is an upper portion of the semiconductor substrate, a gate electrode, which is configured to cross the active region and to extend in a first direction, and an active contact, which is on the active region, is spaced apart from the gate electrode, and extends in the first direction. The second test circuit may further include a first gate contact that is connected to the gate electrode and overlaps the active region in a vertical direction perpendicular to the substrate.

20 Claims, 21 Drawing Sheets

(56) References Cited

U.S. PATENT DOCUMENTS

2015/0369860 A1* 12/2015 Ritter ................ G01R 31/2884
  324/762.03
2017/0192050 A1  7/2017 Lei

* cited by examiner

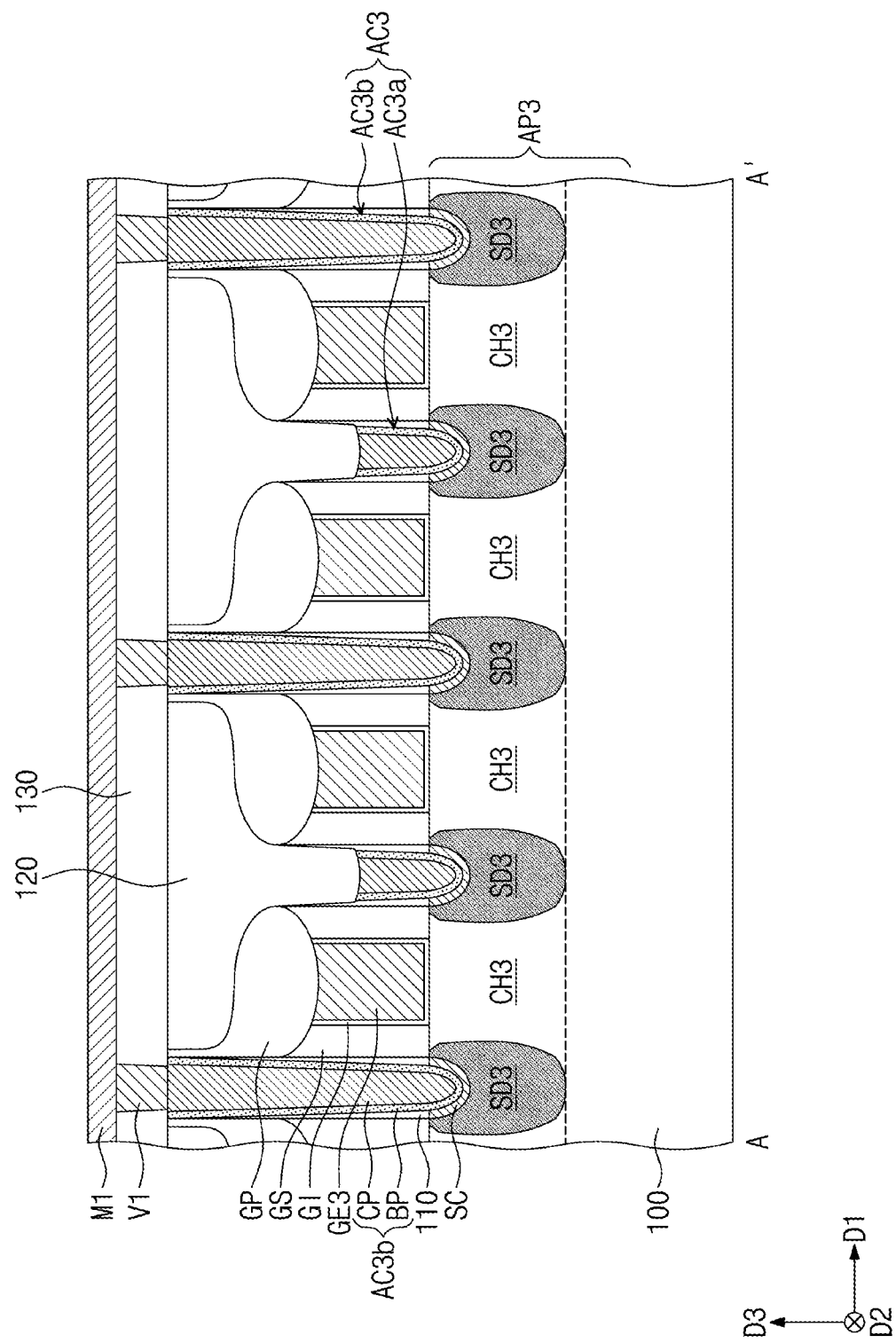

TESTING METHOD OF A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2020-0010477, filed on Jan. 29, 2020, in the Korean Intellectual Property Office, the entire contents of which are hereby incorporated by reference.

BACKGROUND OF THE INVENTION

The present disclosure relates to a method of testing a semiconductor device, and, in particular, to a method of testing a semiconductor device using a test element group (TEG) including different test circuits.

A semiconductor device includes an integrated circuit, which is composed of a metal oxide semiconductor field effect transistor (MOSFET). To meet an increasing demand for a semiconductor device with a small pattern size and a reduced design rule, the MOS-FETs are being scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

To fabricate the semiconductor device, a plurality of integrated circuit chips are formed on a semiconductor substrate, and to determine whether the integrated circuit chips can be normally operated, it may be necessary to measure electric characteristics of the integrated circuit chips after the formation of the integrated circuit chips. Accordingly, test element groups, whose structures are similar to the integrated circuit chips, may be additionally provided on the semiconductor substrate.

SUMMARY

Some embodiments of the inventive concept provide a semiconductor device testing method in which a leakage current of a semiconductor device is measured using a test element group.

According to some embodiments of the inventive concept, a method of testing a semiconductor device may include preparing a semiconductor substrate in which the semiconductor substrate includes a test element group including a first test circuit and a second test circuit, which are different from each other, measuring first and second leakage currents in the first and second test circuits, respectively, and calculating leakage components by comparing the first and second leakage currents. Each of the first and second test circuits may include an active region, which is an upper portion of the semiconductor substrate, a gate electrode, which is configured to cross the active region and to extend in a first direction, and an active contact, which is on the active region, is spaced apart from the gate electrode, and extends in the first direction. The second test circuit may further include a first gate contact, which is connected to the gate electrode and overlaps the active region in a direction perpendicular to the semiconductor substrate.

According to some embodiments of the inventive concept, a method of testing a semiconductor device may include preparing a semiconductor substrate in which the semiconductor substrate includes a test element group including a first test circuit and a second test circuit, which are different from each other, measuring first and second leakage currents in the first and second test circuits, respectively, and calculating first and second leakage components by comparing the first and second leakage currents. Each of the first and second test circuits may include an active region, which is an upper portion of the semiconductor substrate, a gate electrode, which is configured to cross the active region and to extend in a first direction, and an active contact, which is provided on the active region, is spaced apart from the gate electrode, and extends in the first direction. The second test circuit may further include a first gate contact, which is connected to the gate electrode and overlaps the active region in a vertical direction perpendicular to the substrate. The active region may include a plurality of source/drain patterns and a plurality of channel patterns, and the gate electrode at least partially surrounds the channel patterns.

According to some embodiments of the inventive concept, a method of testing a semiconductor device may include preparing a semiconductor substrate in which the semiconductor substrate includes a test element group including a first test circuit and a second test circuit, which are different from each other, measuring first and second leakage currents in the first and second test circuits, respectively, and calculating first and second leakage components by comparing the first and second leakage currents. Each of the first and second test circuits may include an active region, which is an upper portion of the semiconductor substrate, a gate electrode, which is configured to cross the active region and to extend in a first direction, an active contact, which is spaced apart from the gate electrode and extends in the first direction, and a first gate contact, which is connected to the gate electrode and is spaced apart from the active region. The second test circuit may further include a second gate contact, which is on the gate electrode and is overlaps the active region in a vertical direction perpendicular to the substrate. The semiconductor substrate may include a plurality of active patterns protruding from the active region in the vertical direction. The gate electrode may be on top surfaces of the active patterns and at least a portion of side surfaces of the active patterns.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 9A and 9B are sectional views, which are respectively taken along lines A-A' and D-D' of FIG. 8, that illustrate a test circuit of a semiconductor device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
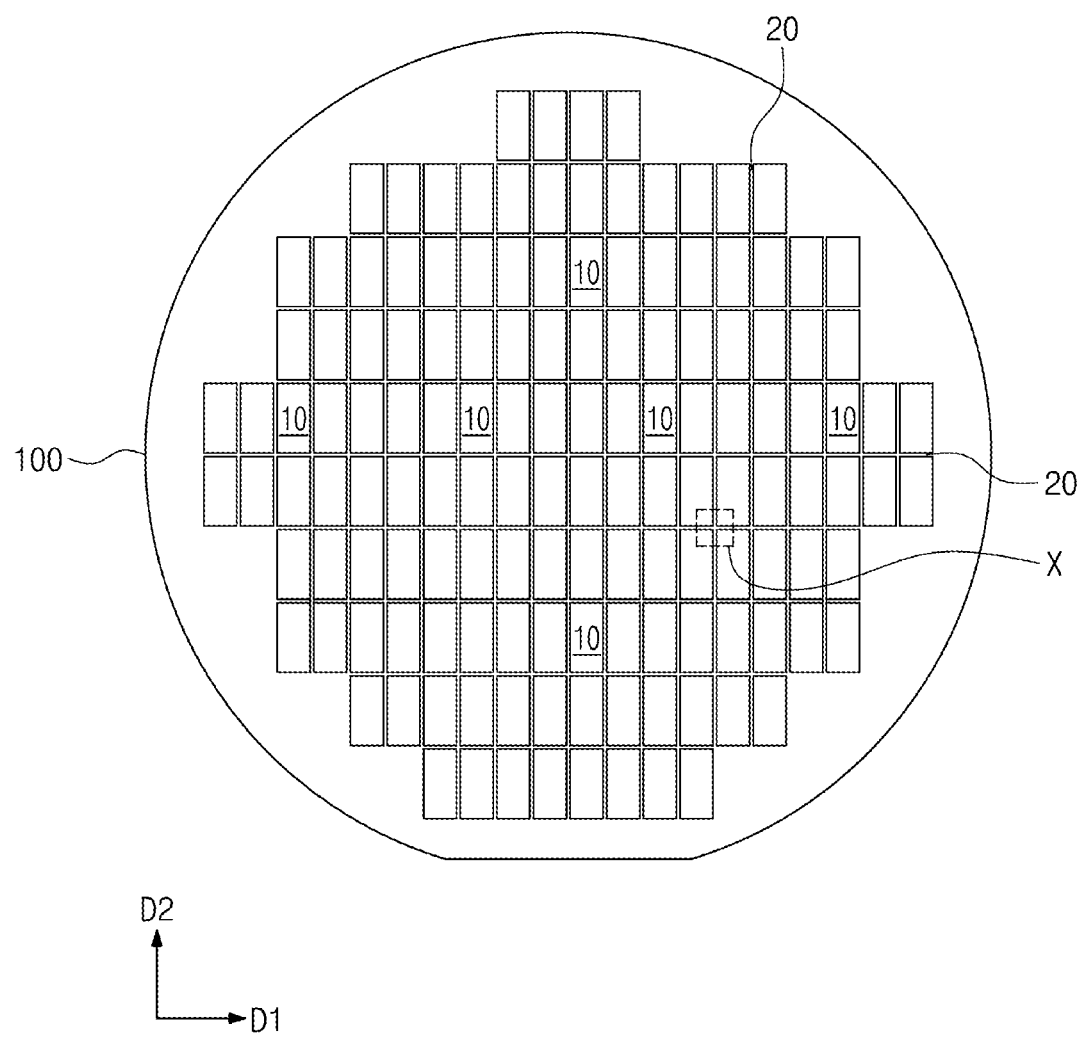
FIG. 1 is a plan view illustrating a semiconductor substrate of a semiconductor device according to some embodiments of the inventive concept.
Figure 2:
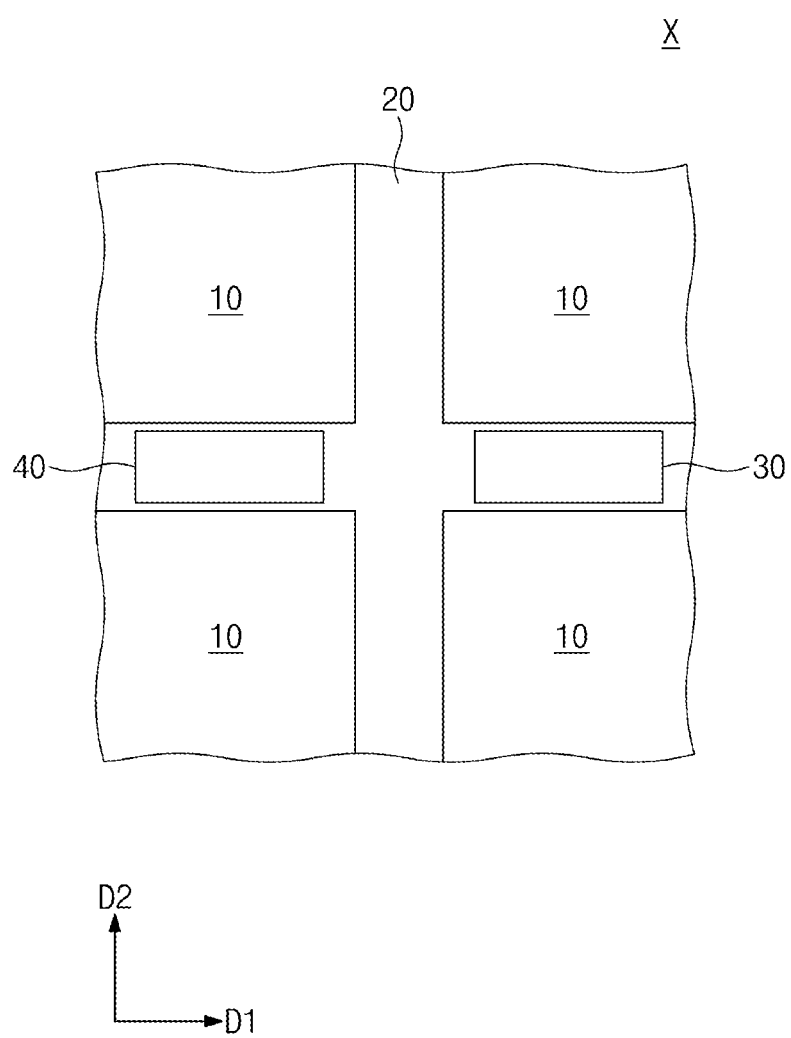
FIG. 2 is an enlarged plan view illustrating a portion (e.g., a portion 'X' of FIG. 1) of a semiconductor device according to some embodiments of the inventive concept.

FIG. 1 is a plan view illustrating a semiconductor substrate of a semiconductor device according to some embodiments of the inventive concept. FIG. 2 is an enlarged plan view illustrating a portion (e.g., a portion 'X' of FIG. 1) of a semiconductor device according to some embodiment s of the inventive concept.

Referring to FIGS. 1 and 2, a semiconductor substrate 100 may include chip regions 10, on which semiconductor integrated circuits are respectively formed, and a scribe line region 20, which is provided between the chip regions 10.

The chip regions 10 may be arranged in two orthogonal directions (e.g., first and second directions D1 and D2) on a top surface of the semiconductor substrate 100. Each of the chip regions 10 may be at least partially enclosed by the scribe line region 20. Although not shown, the scribe line region 20 may include a cutting region, which is configured to facilitate cutting of the semiconductor substrate by way of a sawing or dicing machine, and edge regions, which are provided between the cutting region and the chip regions 10.

The semiconductor substrate 100 may be a substrate including silicon, germanium, silicon-germanium, or combinations thereof, or a substrate made of a compound semiconductor material. In some embodiments, the semiconductor substrate 100 may be a silicon wafer.

In some embodiments, semiconductor memory devices, such as dynamic random access memory (DRAM), static random access memory (SRAM), NAND FLASH memory, and resistive random access memory (RRAM), may be provided on the chip regions 10 of the semiconductor substrate 100. In some embodiments, a micro-electro mechanical system (MEMS) device, an optoelectronic device, or a processor (e.g., CPU or DSP) may be provided on the chip regions 10 of the semiconductor substrate 100. In some embodiments, standard cells including semiconductor elements, such as OR gates or AND gates, may be provided on the chip regions 10 of the semiconductor substrate 100. Redistribution chip pads, which may be used to input or output data or signals to or from the semiconductor integrated circuits, and redistribution pads, which may be used to input or output signals to or from test circuits, may be provided in each of the chip regions 10.

At least one test element group (TEG) 30 may be provided on the scribe line region 20 of the semiconductor substrate 100 to evaluate electrical characteristics of the semiconductor integrated circuits. At least one process control pattern 40 along with the test element group 30 may be provided in the scribe line region 20. In some embodiments, the process control pattern 40 may comprise an alignment pattern (e.g., mark or key), which is used as a base for the alignment during a process of fabricating a semiconductor device and may have various shapes, and a monitoring pattern, which may be used to monitor the process of fabricating the semiconductor device.

Figure 3A:
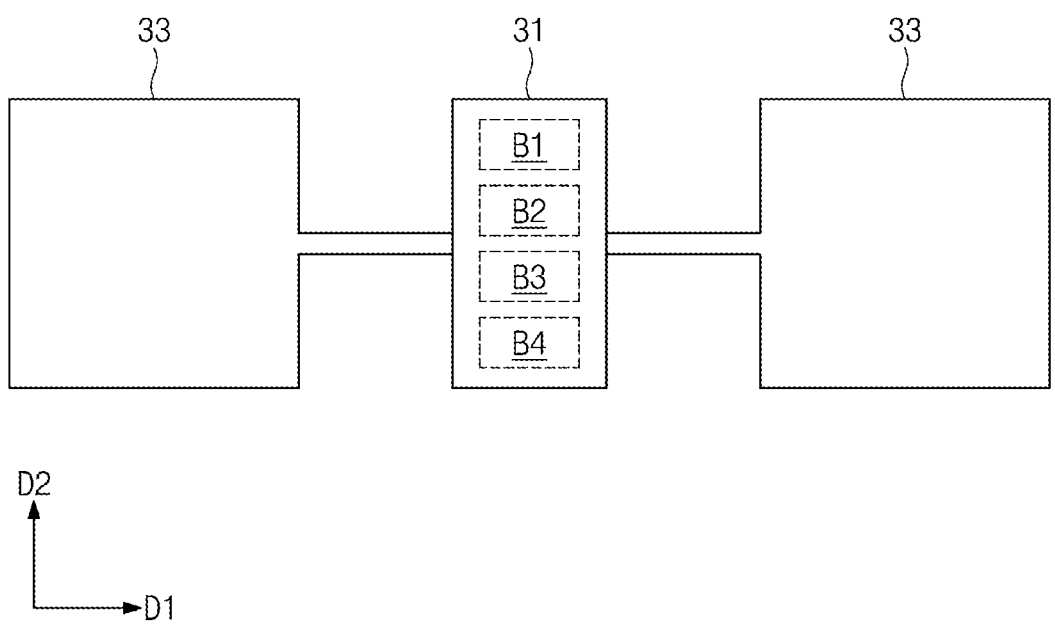
FIG. 3A is a plan view schematically illustrating a test element group of a semiconductor device of FIG. 2, according to some embodiments of the inventive concept.

FIG. 3A is a plan view schematically illustrating a test element group of a semiconductor device of FIG. 2, according to some embodiments of the inventive concept.

Referring to FIG. 3A, the test element group 30 may include at least one test structure 31 and a plurality of test pads 33. A pair of the test pads 33 configured to input and output electrical signals may be connected to the test structure 31.

The test structure 31 may include various circuits, which are used to test semiconductor integrated circuits formed in each of the chip regions 10. According to the embodiment of FIG. 3A, the test structure 31 may include first to fourth test circuits B1-B4, which are different from each other. For example, each of the first to fourth test circuits B1-B4 may include one or more NMOS field effect transistors (NMOS-FETs), PMOS field effect transistors (PMOSFETs), resistors or combinations thereof.

Figure 3B:
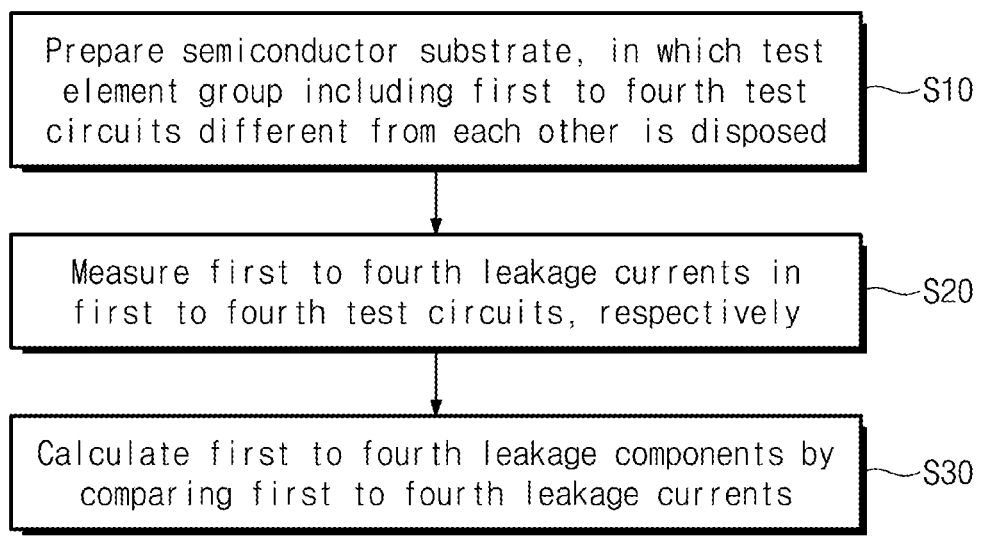
FIG. 3B is a flow chart schematically illustrating a method of testing a semiconductor device according to some embodiment s of the inventive concept.
Figure 3C:
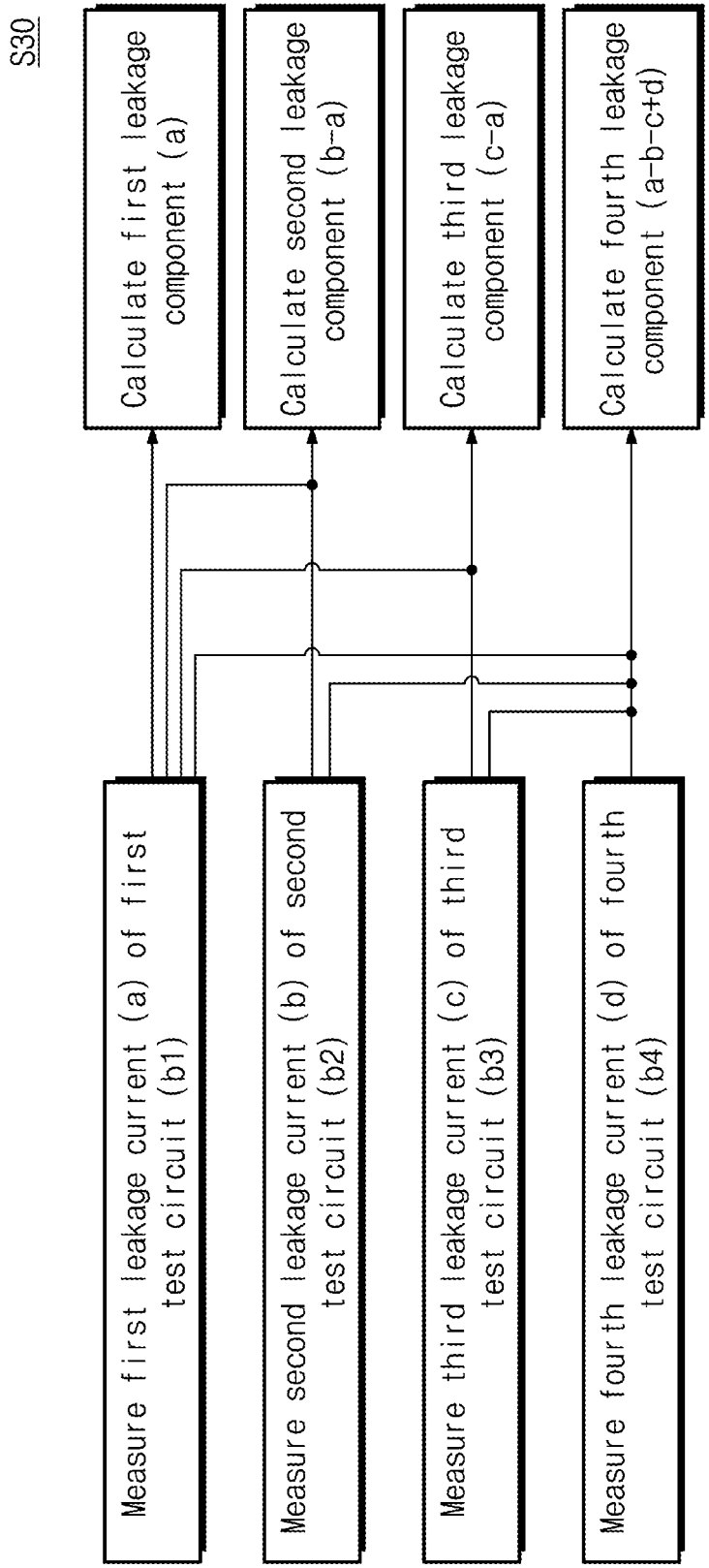
FIG. 3C is a conceptual diagram illustrating a method of calculating leakage components in a method of testing a semiconductor device according to some embodiments of the inventive concept.

FIG. 3B is a flow chart schematically illustrating a method of testing a semiconductor device according to some embodiments of the inventive concept. FIG. 3C is a conceptual diagram illustrating a method of calculating leakage components in a method of testing a semiconductor device, according to some embodiments of the inventive concept.

Referring to FIGS. 3A, 3B, and 3C, a method of testing a semiconductor device according to some embodiments of the inventive concept may include preparing the semiconductor substrate 100 (e.g., see FIG. 1), in which the test element group 30 including the first to fourth test circuits B1-B4 different from each other is disposed, measuring first to fourth leakage currents a to d from the first to fourth test circuits B1-B4, respectively, and comparing the first to fourth leakage currents a to d to calculate first to fourth leakage components.

The first leakage component may be defined as the first leakage current a. The second leakage component may be defined as a difference between the second and first leakage currents b and a. The third leakage component may be defined as a difference between the third and first leakage currents c and a. The fourth leakage component may be defined as a difference between a sum of the first and fourth leakage currents a and d and a sum of the second and third leakage currents b and c. The first to fourth leakage components may be calculated by comparing measured values of the first to fourth leakage currents a, b, c, and d. Some of the leakage currents between elements of the first to fourth test circuits B1-B4 (e.g., corresponding to the first to fourth leakage components) will be described in more detail below.

Figure 4:
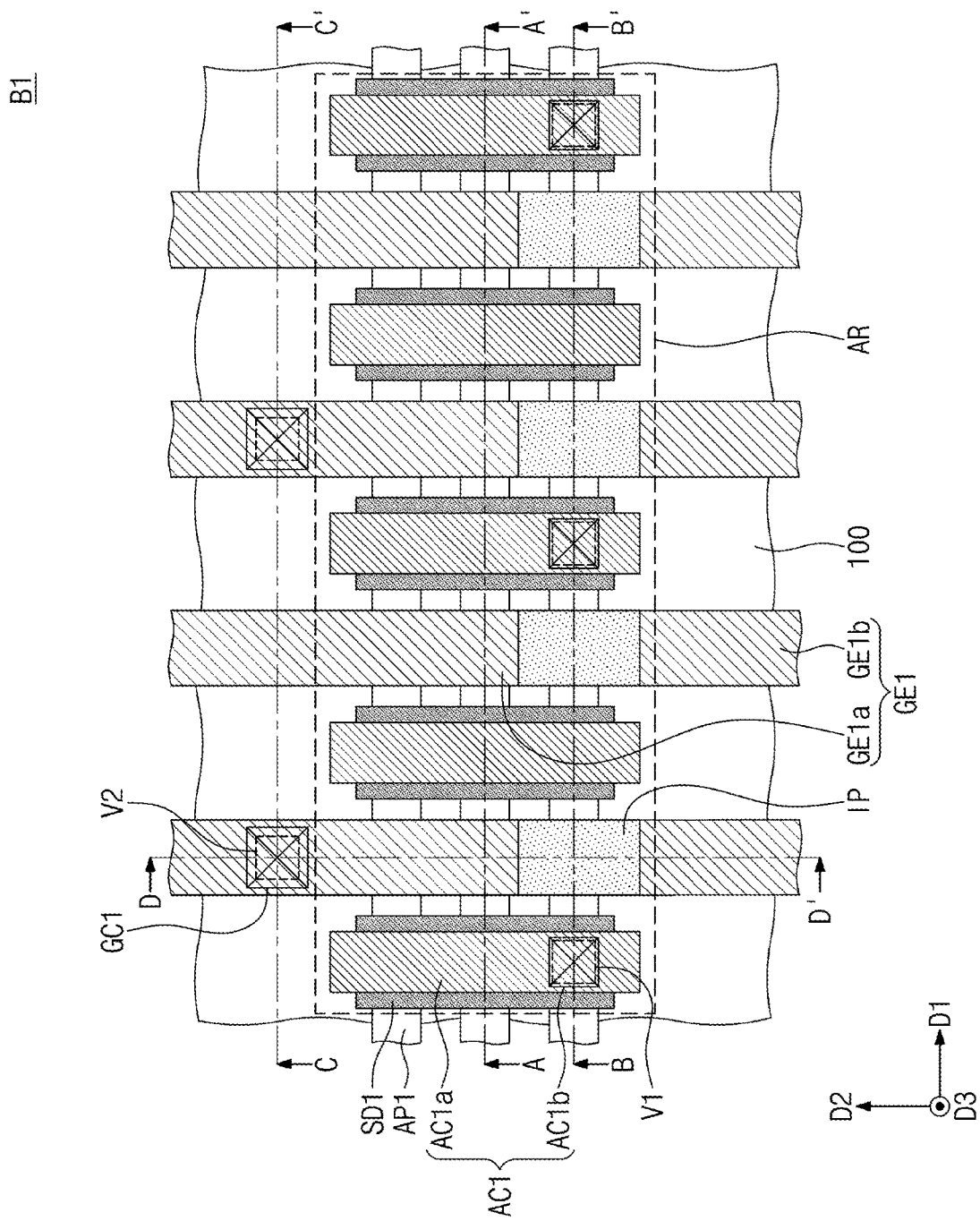
FIGS. 4, 6, 8, and 10 are plan views illustrating test circuits (e.g., portions B1 to B4 of FIG. 3A) of a semiconductor device according to some embodiments of the inventive concept.

FIG. 4 is a plan view illustrating a test circuit (e.g., the portion B1 of FIG. 3A) of a semiconductor device according to some embodiment s of the inventive concept. FIGS. 5A to 5D are sectional views, which are respectively taken along lines A-A', B-B', C-C', and D-D' of FIG. 4 that illustrate a test circuit of a semiconductor device according to some embodiment of the inventive concept.

Referring to FIGS. 4 and 5A to 5D, the semiconductor substrate 100 including an active region AR may be provided. The active region AR may be a vertically protruding portion of the semiconductor substrate 100. As an example, the active region AR may be a region, on which logic transistors constituting a logic circuit will be formed. The logic transistors constituting the logic circuit may be disposed on the logic cell region of the semiconductor substrate 100. The active region AR may include parts of the logic transistors. The active region AR may be an NMOS field effect transistor (NMOSFET) region or a PMOS field effect transistor (PMOSFET) region.

The active region AR may be defined by a first trench TR1, which is formed in an upper portion of the semiconductor substrate 100. The active region AR may extend in the first and second directions D1 and D2. Widths of the active region AR in the first and second directions D1 and D2 may decrease in a third direction D3, when viewed in a sectional view. The third direction D3 may be perpendicular to both of the first and second directions D1 and D2. In some embodiments, although not shown, a plurality of the active regions AR may be provided. The first trench TR1 may be located between the active regions AR. Adjacent ones of the active regions AR may be spaced apart from each other in the second direction D2.

First active patterns AP1 may be provided on the active region AR. The first active patterns AP1 may be portions of the semiconductor substrate 100, which protrude vertically from the active region AR, i.e., in the D3 direction. The first active patterns AP1 may extend in the first direction D1. When viewed in a sectional view, a width of the first active pattern AP1 in the second direction D2 may decrease in the third direction D3.

The first active patterns AP1 may be defined by a second trench TR2, which is formed in an upper portion of the active region AR. The second trench TR2 may be shallower than the first trench TR1. In some embodiments, a bottom surface of the second trench TR2 may be located at a level that is higher than a bottom surface of the first trench TR1 as shown in the cross-sectional view of FIG. 5D.

A device isolation layer ST may at least partially fill the first trench TR1. The device isolation layer ST may be provided to fill at least a portion of the second trench TR2. In some embodiments, the device isolation layer ST may be formed of or include silicon oxide. Upper portions of the first active patterns AP1 may protrude upwardly from the device isolation layer ST in the cross-sectional view of FIG. 5D. Each of the upper portions of the first active patterns AP1 may be shaped like a fin. The device isolation layer ST may not be on an at least partially cover top surfaces of the first active patterns AP1. The device isolation layer ST may be on and may at least partially cover lower portions of side surfaces of the first active patterns AP1.

Figure 5A:
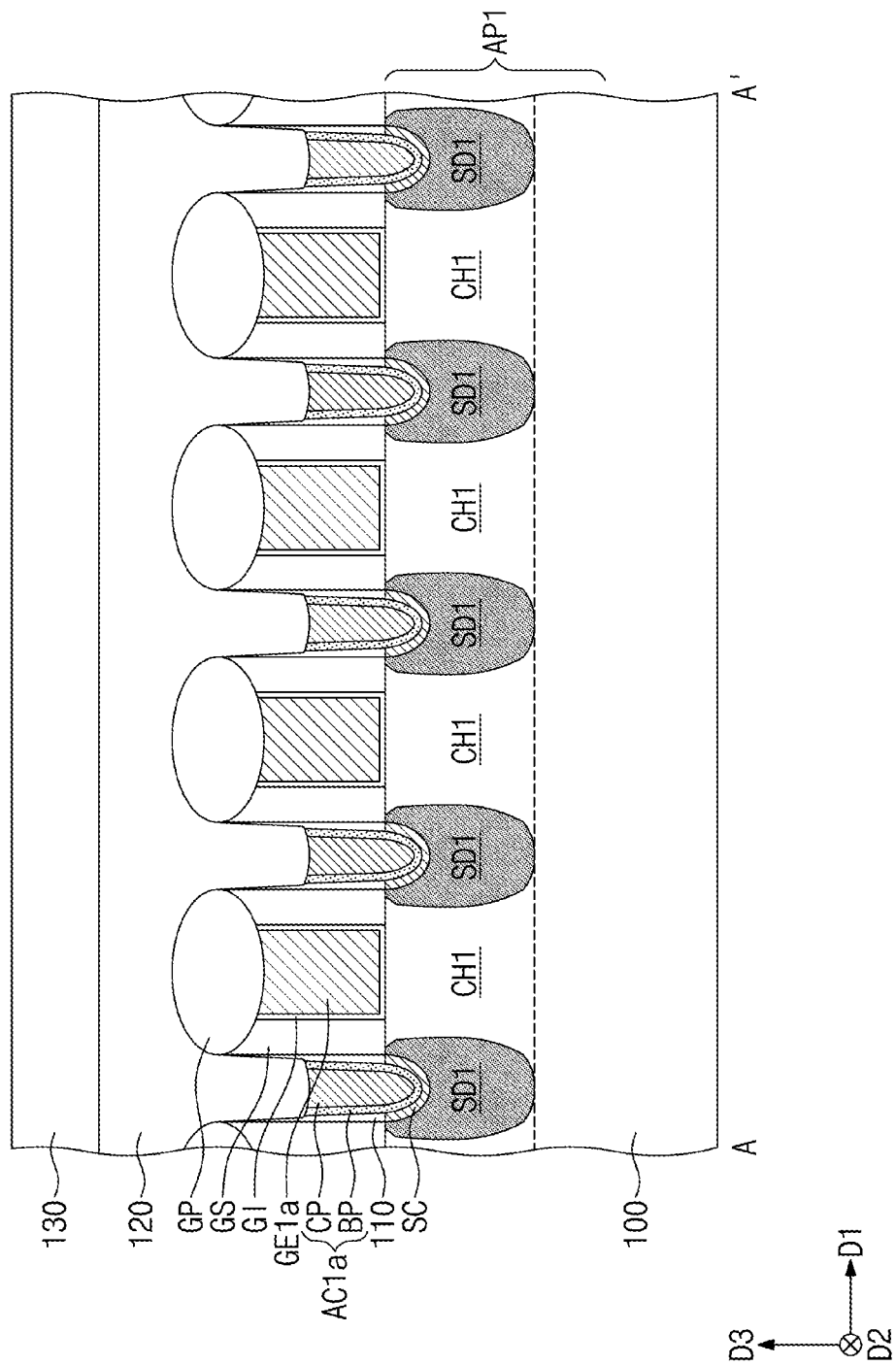
FIGS. 5A to 5D are sectional views, which are respectively taken along lines A-A', B-B', C-C', and D-D' of FIG. 4, that illustrate a test circuit of a semiconductor device according to some embodiments of the inventive concept.
Figure 5B:
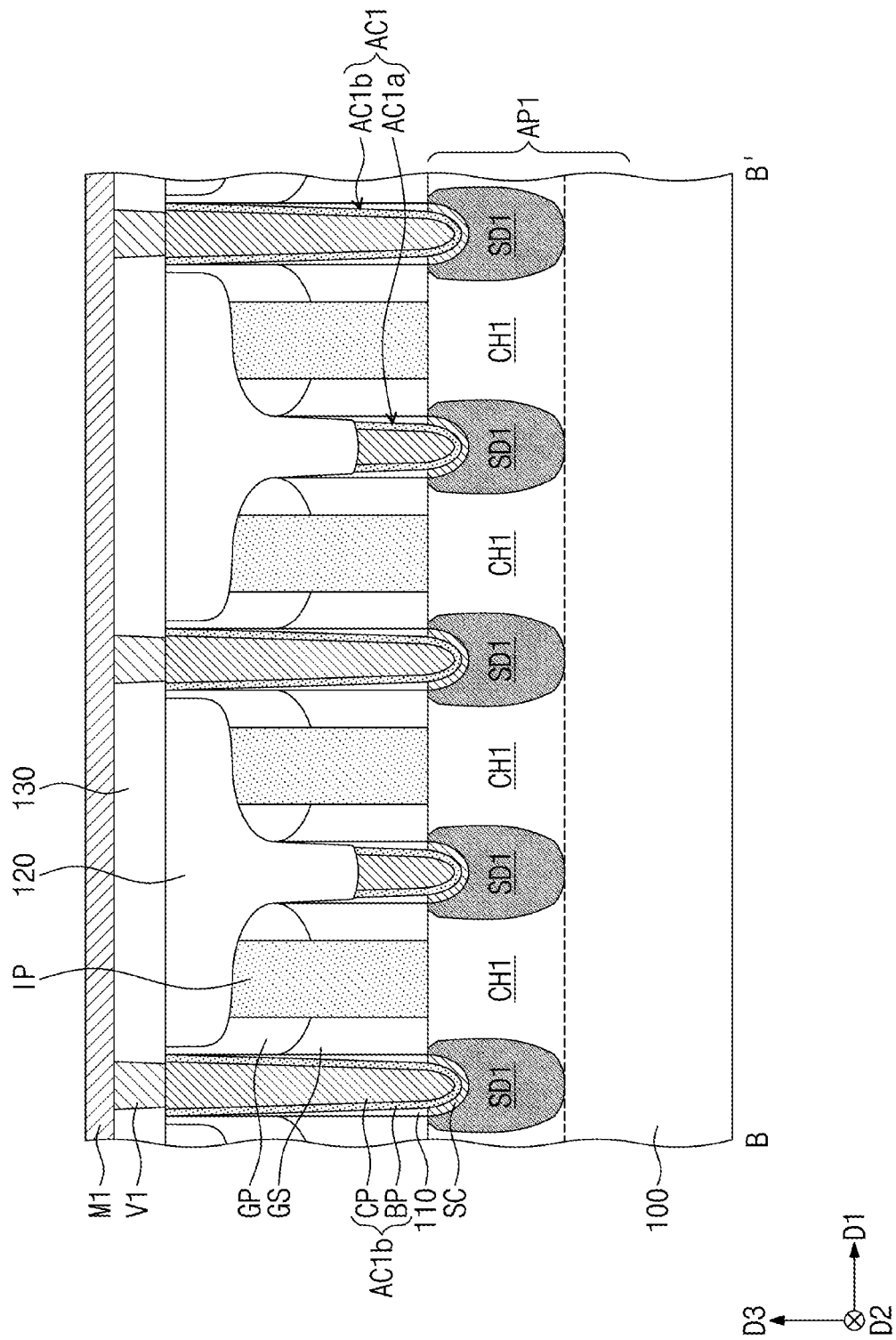
Figure 5C:
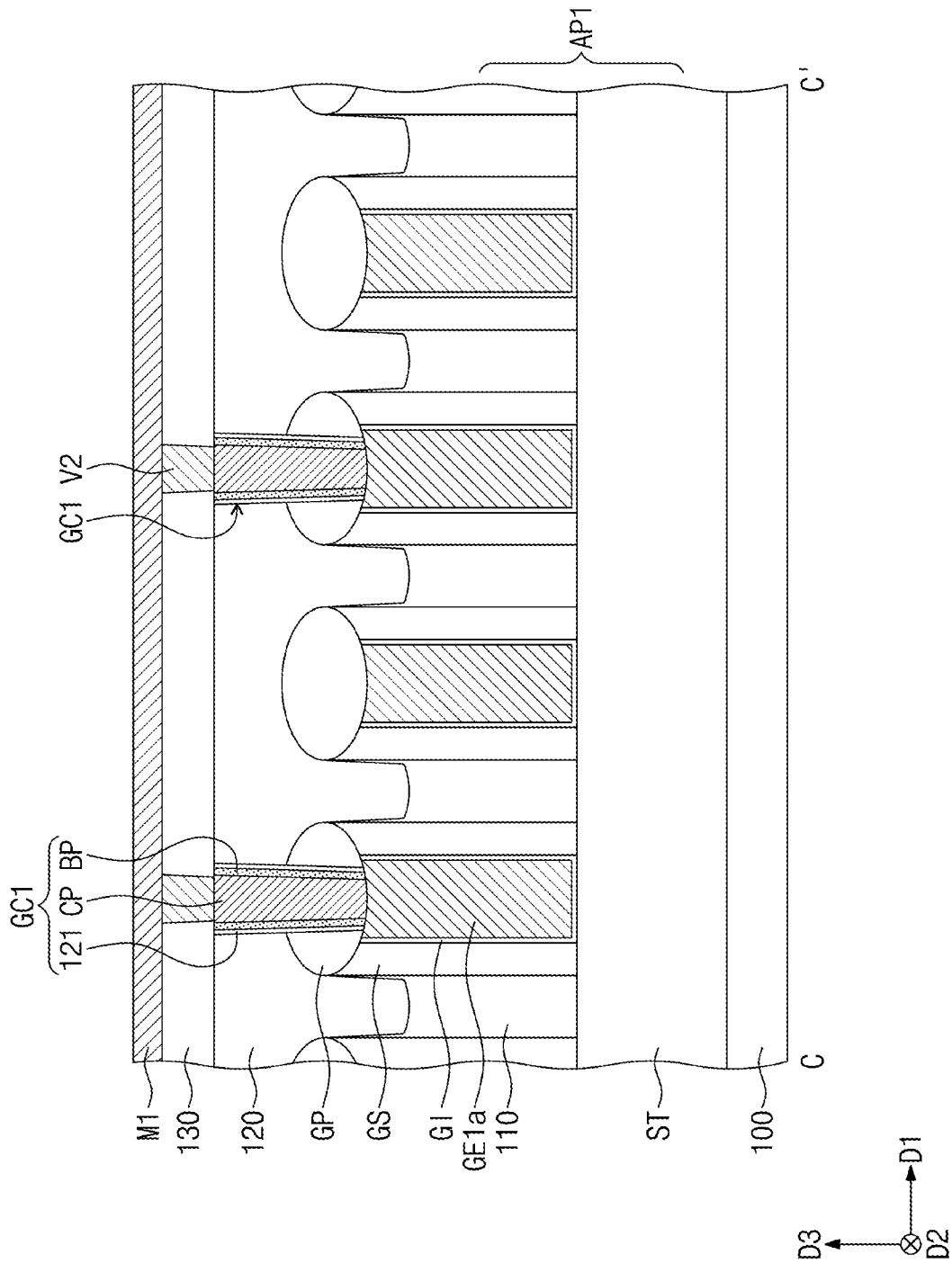

First source/drain patterns SD1 may be provided in upper portions of the first active patterns AP1. The first source/drain patterns SD1 may be impurity regions of a first conductivity type (e.g., p-type) or a second conductivity type (e.g., n-type). One of the first channel patterns CH1 may be interposed between a pair of the first source/drain patterns SD1. The first source/drain patterns SD1 may be epitaxial patterns, which may be formed by a selective epitaxial growth (SEG) process. A top surface of each of the first source/drain patterns SD1 may be positioned at substantially the same level as a top surface of each of the first channel patterns CH1 as shown in FIGS. 5A and 5B.

The first source/drain patterns SD1 may include a semiconductor material (e.g., SiGe), whose lattice constant is greater than that of the semiconductor substrate 100. Accordingly, the first source/drain patterns SD1 may exert a compressive stress on the first channel patterns CH1. In some embodiments, the first source/drain patterns SD1 may include the same semiconductor material (e.g., Si) as the semiconductor substrate 100.

First gate electrodes GE1 may be provided to cross the first active patterns AP1 and to extend in the second direction D2. The first gate electrodes GE1 may be arranged in the first direction D1 with a specific pitch. The first gate electrodes GE1 may overlap the first channel patterns CH1 in the third direction D3. The first gate electrodes GE1 may be on and at least partially cover a top surface TS1 of each of the first channel patterns CH1 and side surfaces SW1 of each of the first channel patterns CH1. The first gate electrodes GE1 may border and at least partially surround the first channel patterns CH1. Accordingly, each of the first gate electrodes GE1 may serve as a gate electrode of a three-dimensional field effect transistor (e.g., FinFET).

A pair of gate spacers GS may be disposed on both side surfaces of each of the first gate electrodes GE1. The gate spacers GS may be extended along the first gate electrodes GE1 and in the second direction D2. The gate spacers GS may be formed of or include, for example, SiCN, SiCON, or SiN or combinations thereof. In certain embodiments, the gate spacers GS may have a multi-layered structure including at least two of SiCN, SiCON, or SiN layers.

A gate capping pattern GP may be provided on each of the first gate electrodes GE1. The gate capping pattern GP may extend along each of the first gate electrodes GE1 and in the second direction D2. In an embodiment, the gate capping pattern GP may extend to regions on top surfaces of the gate spacers GS adjacent thereto and may overlap one of the first gate electrodes GE1 and the gate spacers GS adjacent thereto in the third direction D3. For example, the thickness of the gate capping pattern GP may be maximum on a region that overlaps each of the first gate electrodes GE1 and may decrease with decreasing distance to the gate spacers GS. In some embodiments, a portion of the gate capping pattern GP may extend along a side surface of a second portion AC1b of each of first active contacts AC1, which will be described below, and may be in contact with a third interlayer insulating layer 130, which will be described below. The gate capping pattern GP may be formed of or include one or more materials, which are selected to have an etch selectivity with respect to first and second interlayer insulating layers 110 and 120 to be described below. For example, the gate capping pattern GP may be formed of or include SiON, SiCN, SiCON, or SiN or combinations thereof.

A gate dielectric pattern GI may be interposed between the first gate electrodes GE1 and the first active patterns AP1. The gate dielectric pattern GI may be extended along a bottom surface of each of the first gate electrodes GE1. The gate dielectric pattern GI may be on and at least partially cover the top surfaces TS1 and the side surfaces SW1 of the first channel patterns CH1. The gate dielectric pattern GI may extend to a top surface of the device isolation layer ST, which is disposed below the first gate electrodes GE1. The gate dielectric pattern GI may be interposed between the first gate electrodes GE1 and the gate spacers GS adjacent thereto.

The gate dielectric pattern GI may be formed of or include high-k dielectric materials, whose dielectric constants are higher than silicon oxide, or ferroelectric materials, or combinations thereof. For example, the gate dielectric pattern GI may include high-k dielectric materials (e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate or combinations thereof). In certain embodiments, the gate dielectric pattern GI may be formed of or include a ferroelectric material (e.g., hafnium oxide), which is doped or provided with zirconium (Zr), silicon (Si), aluminum (Al), or lanthanum (La) or combinations thereof. In embodiments in which the hafnium oxide is doped with zirconium (Zr), silicon (Si), aluminum (Al), or lanthanum (La) or combinations thereof in a specific content, at least a portion of the ferroelectric material may have an orthorhombic crystal structure. In embodiments in which at least a portion of the ferroelectric material has the orthorhombic crystal structure, a negative capacitance effect may occur.

Each of the first gate electrodes GE1 may include a first metal pattern and a second metal pattern on the first metal pattern. The first metal pattern may be provided on the gate dielectric pattern GI and adjacent to the first channel patterns CH1. The first metal pattern may include a work function metal, which can be used to adjust a threshold voltage of the transistor. By adjusting a thickness and composition of the first metal pattern, it may be possible to realize a transistor having a desired threshold voltage. As an example, the first metal pattern may include one or more metal nitrides. For example, the first metal pattern may include one or more metals, which may include, but are not limited to, titanium (Ti), tantalum (Ta), aluminum (Al), tungsten (W) and molybdenum (Mo), or nitrogen (N) or combinations thereof. In addition, the first metal pattern may further include carbon (C). The first metal pattern may include a plurality of work function metal layers, which are stacked. The second metal pattern may include a metallic material whose resistance is lower than the first metal pattern. For example, the second metal pattern may include one or more metals, which may include, but are not limited to, tungsten (W), aluminum (Al), titanium (Ti), or tantalum (Ta) or combinations thereof.

In the first test circuit B1, each of the first gate electrodes GE1 may include a first electrode GE1*a* and a second electrode GE1*b*. The first electrode GE1*a* and the second electrode GE1*b* may be spaced apart from each other in the second direction D2 with an isolation pattern IP interposed therebetween. The first electrode GE1*a* may be connected to one of the first gate contacts GC1, which will be described below.

Figure 5D:
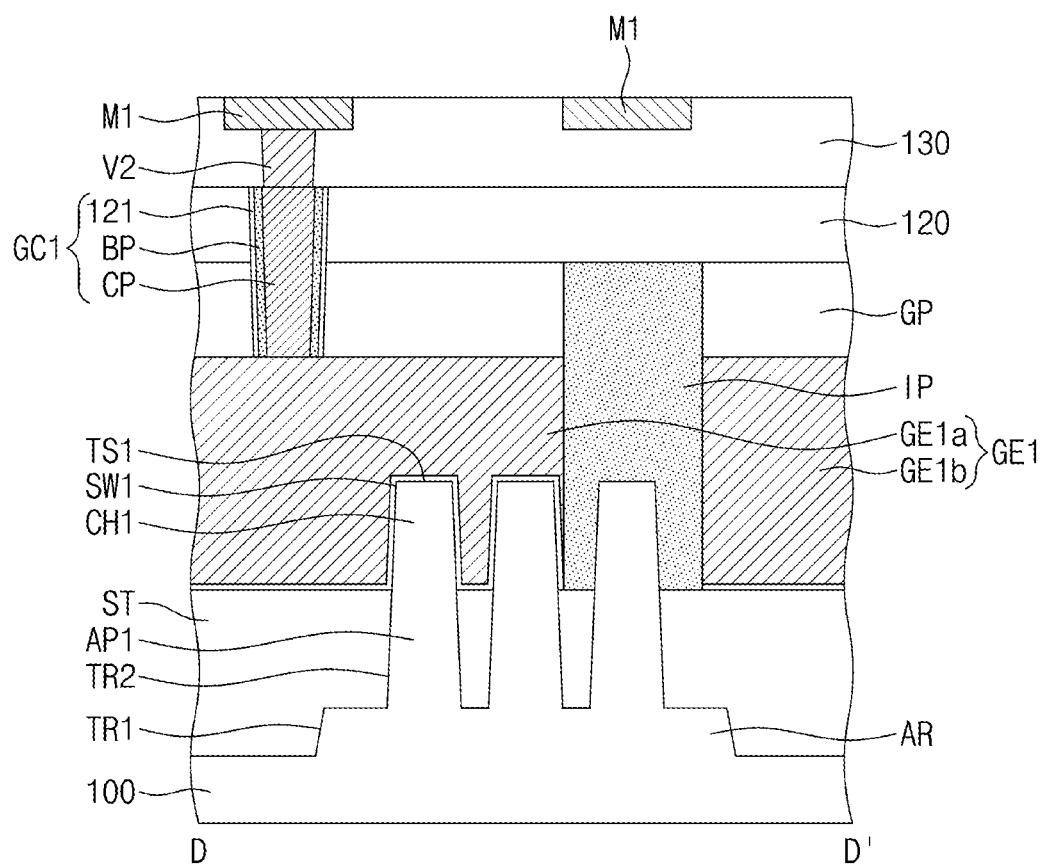
Figure 5D:
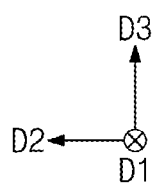

The isolation pattern IP may be on and cover a portion of the top surface of the device isolation layer ST and the top surface TS1 and the side surfaces SW1 of one of the first channel patterns CH1. The isolation pattern IP may be provided to penetrate the gate capping pattern GP and one of the first gate electrodes GE1 and to be in physical contact with one of the first channel patterns CH1 of the first active patterns AP1. In some embodiments, a top surface of the isolation pattern IP may be coplanar with the top surface of the gate capping pattern GP as shown in FIG. 5D. For example, the isolation pattern IP may be formed of or include SiON, SiCN, SiCON, or SiN or combinations thereof.

A first interlayer insulating layer 110 may be provided on the semiconductor substrate 100. The first interlayer insulating layer 110 may be on and partly cover the gate spacers GS and the first source/drain patterns SD1. A second interlayer insulating layer 120 may be formed on the first interlayer insulating layer 110 to be on and at least partially cover the gate capping pattern GP. In some embodiments, the first and second interlayer insulating layers 110 and 120 may be formed of or include silicon oxide.

The first active contacts AC1, which are electrically and respectively connected to the first source/drain patterns SD1, may be provided on the active region AR. Each of the first active contacts AC1 may be provided between a pair of the first gate electrodes GE1. When viewed in a plan view, the first active contacts AC1 may have bar-shaped patterns extending in the second direction D2.

Each of the first active contacts AC1 may include a conductive pattern CP and a barrier pattern BP bordering or surrounding the conductive pattern CP. For example, the conductive pattern CP may be formed of or include one or more metallic materials (e.g., aluminum, copper, tungsten, molybdenum, or cobalt or combinations thereof). For example, the barrier pattern BP may be provided to be on and cover side and bottom surfaces of the conductive pattern CP. The barrier pattern BP may include a metal layer and/or a metal nitride layer. The metal layer may be formed of or include titanium, tantalum, tungsten, nickel, cobalt, or platinum or combinations thereof. The metal nitride layer may be formed of or include titanium nitride (TiN), tantalum nitride (TaN), tungsten nitride (WN), nickel nitride (NiN), cobalt nitride (CoN), or platinum nitride (PtN) or combinations thereof.

Each of the first active contacts AC1 may include a first portion AC1*a* and a second portion AC1*b*. The first portion AC1*a* of each of the first active contacts AC1 may be defined as a portion whose top surface is recessed toward the semiconductor substrate 100. The second portion AC1*b* of each of the first active contacts AC1 may be defined as a portion whose top surface is coplanar with the top surface of the second interlayer insulating layer 120.

In some embodiments, the top surface of the first portion AC1*a* may be positioned at a level lower than the top surfaces of the first gate electrodes GE1 (FIG. 5A), and the top surface of the second portion AC1*b* may be positioned at a level higher than the top surfaces of the first gate electrodes GE1 (FIGS. 5A and 5B). A height of the second portion AC1*b* in the third direction D3 may be greater than a height of the first portion AC1*a* in the third direction D3. Accordingly, it may be possible to prevent or reduce the likelihood of a short circuit from being formed between the first portion AC1a of each of the first active contacts AC1 and the first gate electrodes GE1 adjacent thereto.

The top surface of the first portion AC1a may be in physical contact with the second interlayer insulating layer 120. The second portion AC1b may be electrically connected to one of first interconnection lines M1 through one of first vias V1 to be described below.

At least one of the first active contacts AC1 may not include the second portion AC1b. Such first active contacts AC1 may not have a portion located at a level higher than the top surfaces of the first gate electrodes GE1 in a cross-sectional view thereof. As an example, a width of the first and second portions AC1a and AC1b in the first direction D1 may decrease in the third direction D3.

Unlike the structure illustrated in the drawings, each of the first active contacts AC1 may be on and cover at least a portion of the side surfaces of the gate spacers GS. Each of the first active contacts AC1 may be a self-aligned contact. For example, each of the first active contacts AC1 may be formed, in a self-aligned manner, using the gate capping pattern GP and the gate spacers GS.

When viewed in a plan view, the second portion AC1b of each of the first active contacts AC1 may be adjacent to the isolation pattern IP in the first direction D1. The second portion AC1b of each of the first active contacts AC1 may not be adjacent to the first gate electrodes GE1 in the first direction D1. Accordingly, in the first test circuit B1, it may be possible to reduce or prevent a leakage current between the second portion AC1b of each of the first active contacts AC1 and the first gate electrodes GE1.

A silicide pattern SC may be interposed between the first active contacts AC1 and the first source/drain patterns SD1. In some embodiments, the silicide pattern SC may border or surround a portion of the barrier pattern BP of each of the first active contacts AC1. Each of the first active contacts AC1 may be electrically connected to one of the first source/drain patterns SD1 through the silicide pattern SC. The silicide pattern SC may be formed of or include one or more metal-silicide materials. For example, the silicide pattern SC may be formed of or include titanium silicide, tantalum silicide, tungsten silicide, nickel silicide, or cobalt silicide or combinations thereof.

The first gate contacts GC1, which are electrically connected to the first electrodes GE1a of the first gate electrodes GE1, may be provided to penetrate the second interlayer insulating layer 120 and the gate capping pattern GP. The first gate contacts GC1 may be provided on some of the first gate electrodes GE1. One of the first gate contacts GC1 may be spaced apart from another of the first gate contacts GC1 in the first direction D1 with one of the first gate electrodes GE1 interposed therebetween.

The first gate contacts GC1 may be provided on portions of the device isolation layer ST located outside the active region AR. The first gate contacts GC1 may not overlap the active region AR in the third direction D3. In some embodiments, widths of the first gate contacts GC1 in the first and second directions D1 and D2 may decrease in the third direction D3. Each of the first gate contacts GC1 may include the conductive pattern CP and the barrier pattern BP bordering or surrounding the conductive pattern CP, similar to the first active contacts AC1. Each of the first gate contacts GC1 may further include a first insulating pattern 121 bordering or surrounding the barrier pattern BP. The first insulating pattern 121 may be formed of or include, for example, $SiO_2$, SiON, SiCN, SiCON, or SiN or combinations thereof.

The third interlayer insulating layer 130 may be provided on the second interlayer insulating layer 120. In some embodiments, the third interlayer insulating layer 130 may be formed of or include silicon oxide. The first interconnection lines M1, the first vias V1, and the second vias V2 may be provided in the third interlayer insulating layer 130. Each of the first and second vias V1 and V2 may be electrically connected to a corresponding one of the first interconnection lines M1. The first and second vias V1 and V2 may be provided below the first interconnection lines M1 (FIG. 5D). Each of the first vias V1 may be interposed between one of the first interconnection lines M1 and the second portion AC1b of one of the first active contacts AC1 to electrically connect them to each other. Each of the second vias V2 may be interposed between one of the first interconnection lines M1 and one of the first gate contacts GC1 to electrically connect them to each other.

The first interconnection lines M1 may extend in the first direction D1 to be parallel to each other. The first interconnection lines M1 may be arranged in the second direction D2. In some embodiments, the first interconnection lines M1 and the first and second vias V1 and V2 thereunder may be connected to each other to constitute a single (e.g., monolithic) conductive structure. For example, the first interconnection lines M1 and the first and second vias V1 and V2 may be formed concurrently (e.g., by the same process). In an embodiment, the first interconnection lines M1 and the first and second vias V1 and V2 constituting the single conductive structure may be formed by a dual damascene process. Although not shown, interconnection lines (e.g., M2, M3, M4, and so forth) may be additionally provided on the third interlayer insulating layer 130.

Although not shown, an etch stop layer may be interposed between the second and third interlayer insulating layers 120 and 130. The etch stop layer may be directly on and at least partially cover the top surface of the second portion AC1b of one of the first active contacts AC1 and the top surface of each of the first gate contacts GC1. The etch stop layer may be directly on and at least partially cover the second portion AC1b of one of the first active contacts AC1 and the top surface of the barrier pattern BP of each of the first gate contacts GC1. The etch stop layer may include a material having an etch selectivity with respect to the third interlayer insulating layer 130. For example, the etch stop layer may be formed of or include SiON, SiCN, SiCON, or SiN or combinations thereof.

Referring to FIGS. 3C, 4A, and 5A, the first test circuit B1 may be used to measure a leakage current flowing through the first interconnection lines M1 and the first and second vias V1 and V2 connected thereto. For example, in embodiments where, although not illustrated, there is a vertically-overlapped portion between the first active contacts AC1 and the first gate electrodes GE1, the first test circuit B1 may measure a current between the first active contacts AC1 and the first gate electrodes GE1 through the first and second vias V1 and V2. In more detail, a leakage current between the first portion AC1a of one of the first active contacts AC1 and the first electrode GE1a of one of the first gate electrodes GE1 may be measured by the first test circuit B1. In this case, it may be possible to determine whether a short circuit is formed between the first portion AC1a of the first active contacts AC1, which are adjacent to each other, and the first gate electrodes GE1. The leakage current may be defined as the first leakage current a (i.e., the first leakage component) measured by the first test circuit B1.

Figure 6:
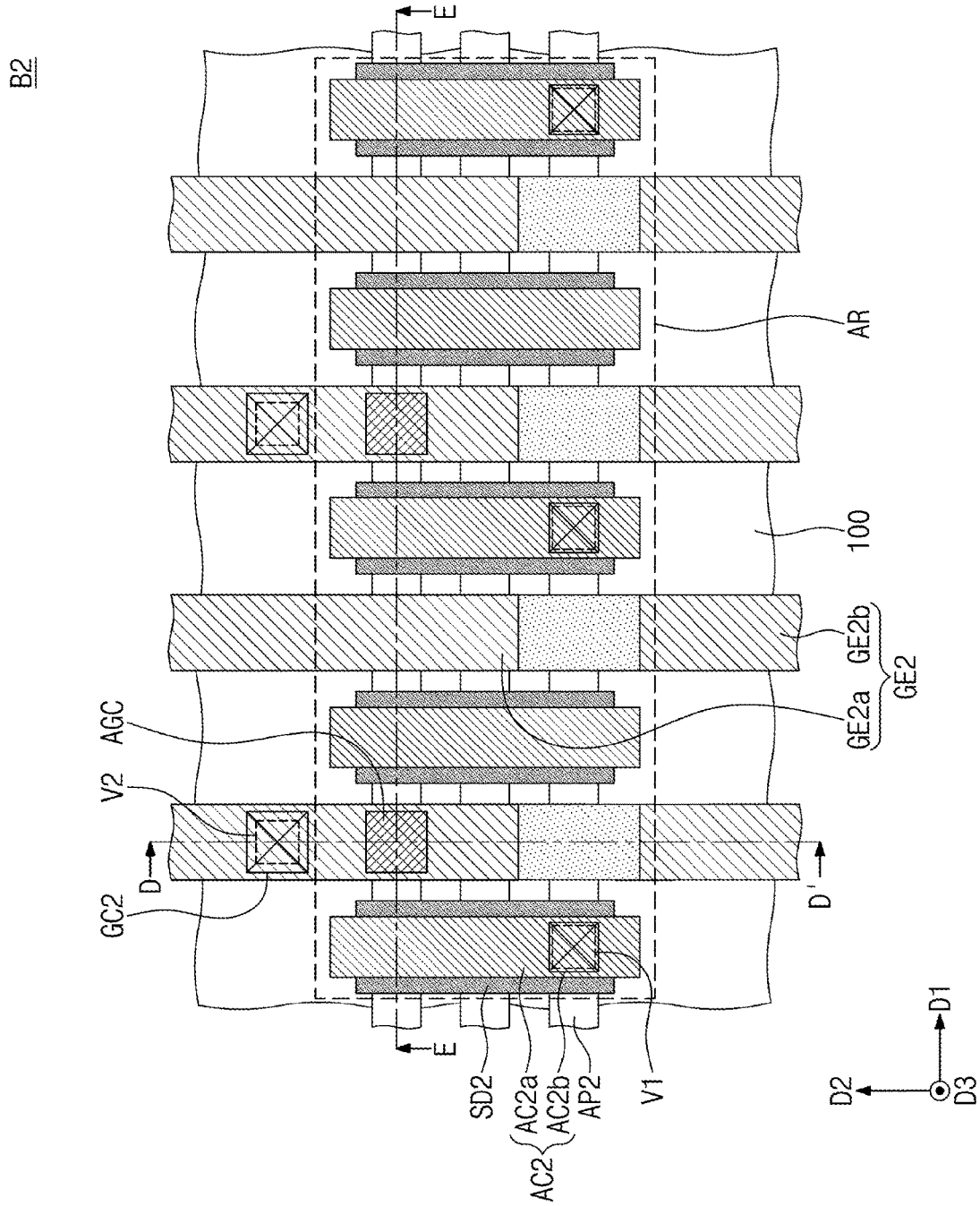
Figure 7A:
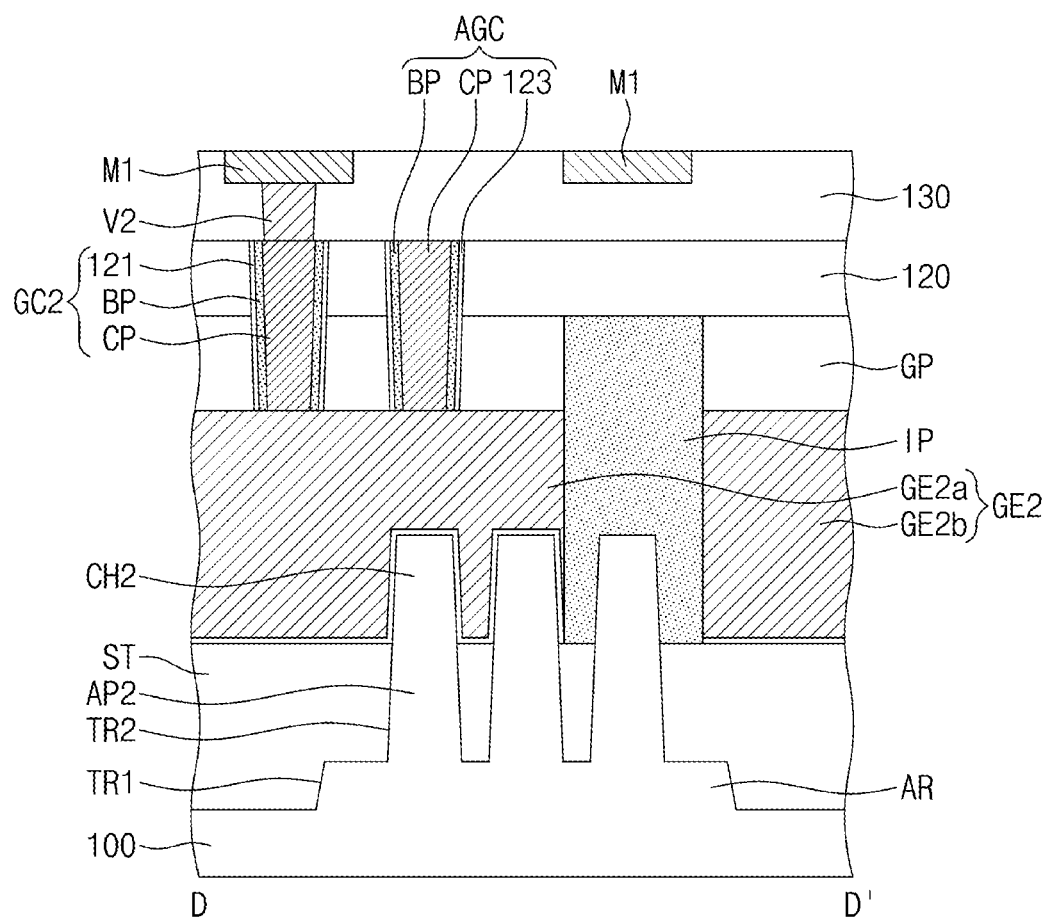
FIGS. 7A and 7B are sectional views, which are respectively taken along lines D-D' and E-E' of FIG. 6, that illustrate a test circuit of a semiconductor device according to some embodiments of the inventive concept.
Figure 7A:
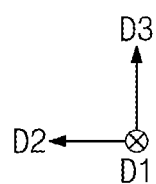
Figure 7B:
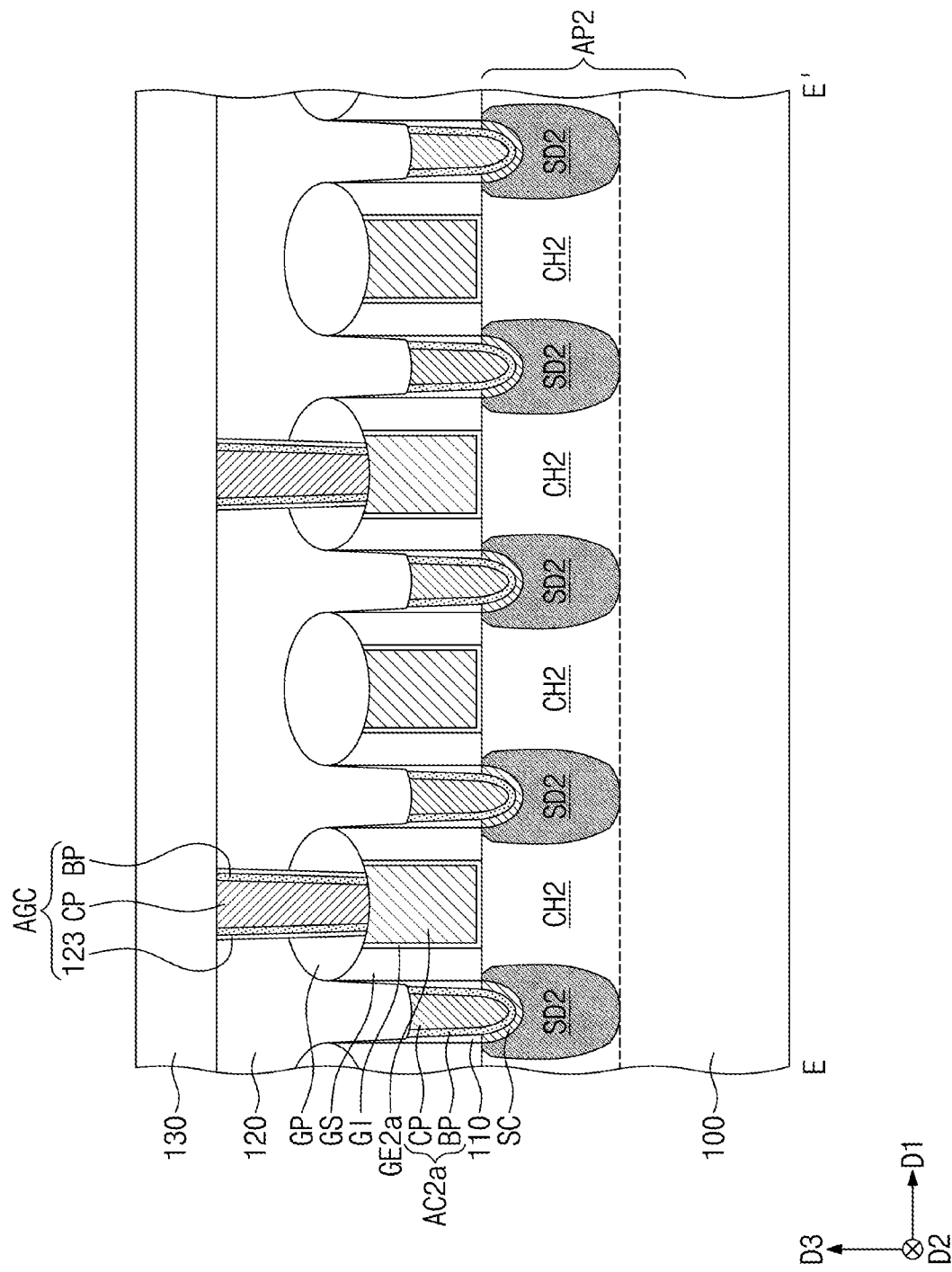

FIG. 6 is a plan view illustrating a test circuit (e.g., the portion B2 of FIG. 3A) of a semiconductor device according to some embodiments of the inventive concept. FIGS. 7A and 7B are sectional views, which are respectively taken along lines D-D' and E-E' of FIG. 6, that illustrate a test circuit of a semiconductor device according to some embodiments of the inventive concept. In the following description, a previously-described element will be identified by the same reference number without repeating an overlapping description thereof, for convenience in description.

Referring to FIGS. 6, 7A, and 7B, active gate contacts AGC, which are electrically connected to the first electrodes GE2a of the second gate electrodes GE2, may be provided to penetrate the second interlayer insulating layer 120 and the gate capping pattern GP. The active gate contacts AGC may be provided on some of the second gate electrodes GE2. One of the active gate contacts AGC may be spaced apart from another of the active gate contacts AGC in the first direction D1 with one of the second gate electrodes GE2 interposed therebetween. The active gate contacts AGC may be provided on second active patterns AP2. The active gate contacts AGC may overlap the active region AR in the third direction D3.

Top surfaces of the active gate contacts AGC may be coplanar with the top surface of the second interlayer insulating layer 120. The top surfaces of the active gate contacts AGC may be coplanar with top surfaces of second gate contacts GC2. The third interlayer insulating layer 130 may be on and at least partially cover top surfaces of the active gate contacts AGC. The top surfaces of the active gate contacts AGC may not be connected to any one of the first and second vias V1 and V2.

The active gate contacts AGC may be spaced apart from the second gate contacts GC2 in the second direction D2. The active gate contacts AGC may be spaced apart from the isolation pattern IP in the second direction D2. In some embodiments, widths of the active gate contacts AGC in the first and second directions D1 and D2 may decrease in the third direction D3.

Each of the active gate contacts AGC may include the conductive pattern CP and the barrier pattern BP bordering or surrounding the conductive pattern CP, similar to first active contacts AC1 and the first gate contacts GC1 shown in FIGS. 4 and 5A to 5D. Each of the active gate contacts AGC may further include a second insulating pattern 123 bordering or surrounding the barrier pattern BP, similar to the second gate contacts GC2. The second insulating pattern 123 may be formed of or include, for example, SiO$_2$, SiON, SiCN, SiCON, or SiN or combinations thereof.

Each of the second gate electrodes GE2 may include a first electrode GE2a and a second electrode GE2b, which are spaced apart from each other in the second direction D2 with the isolation pattern IP interposed therebetween, similar to the first gate electrodes GE1 of the first test circuit B1 (e.g., see FIG. 4). The first electrode GE2a of each of the second gate electrodes GE2 may be connected to the second gate contacts GC2 and the active gate contacts AGC.

Similar to the first active contacts AC1 (e.g., see FIGS. 4, 5A, and 5B) of the first test circuit B1 (e.g., see FIG. 4), the second active contacts AC2 may be provided on the active region AR and may be electrically connected to second source/drain patterns SD2, respectively, and may include a first portion AC2a, whose top surface is recessed toward the semiconductor substrate 100, and a second portion AC2b, whose top surface is coplanar with the top surface of the second interlayer insulating layer 120.

When viewed in a plan view, the active gate contacts AGC may be spaced apart from the second active contacts AC2 in the first direction D1. The active gate contacts AGC and the first portion AC2a of each of the second active contacts AC2 may be adjacent to each other in the first direction D1. The active gate contacts AGC and the second portion AC2b of each of the second active contacts AC2 may not be adjacent to each other in the first direction D1. The second portion AC2b of each of the second active contacts AC2 and the isolation pattern IP may be adjacent to each other in the first direction D1. The second portion AC2b of each of the second active contacts AC2 and the second gate electrodes GE2 may not be adjacent to each other in the first direction D1. As a result, in the second test circuit B2, a leakage current between the second portion AC2b of each of the second active contacts AC2 and the active gate contacts AGC may not be measured.

Referring to FIGS. 3C, 6, and 7A, the second test circuit B2 may be used to measure a leakage current flowing through the first interconnection lines M1 and the first and second vias V1 and V2 connected thereto, similar to the first test circuit B1. In more detail, leakage currents between the first portion AC2a of one of the second active contacts AC2 and the first electrode GE2a of one of the second gate electrodes GE2 and between the first portion AC2a of one of the second active contacts AC2 and one of the active gate contacts AGC may be measured by the second test circuit B2. In such embodiments, it may be possible to determine whether a short circuit is formed between elements of the second test circuit B2.

A sum of the leakage currents may be defined as the second leakage current b measured by the second test circuit B2. The second leakage component may be defined as a difference between the second leakage current b and the first leakage current a, which is measured by the first test circuit B1. The second leakage component may be a leakage current between the first portion AC2a of the second active contacts AC2 and the active gate contacts AGC.

Figure 8:
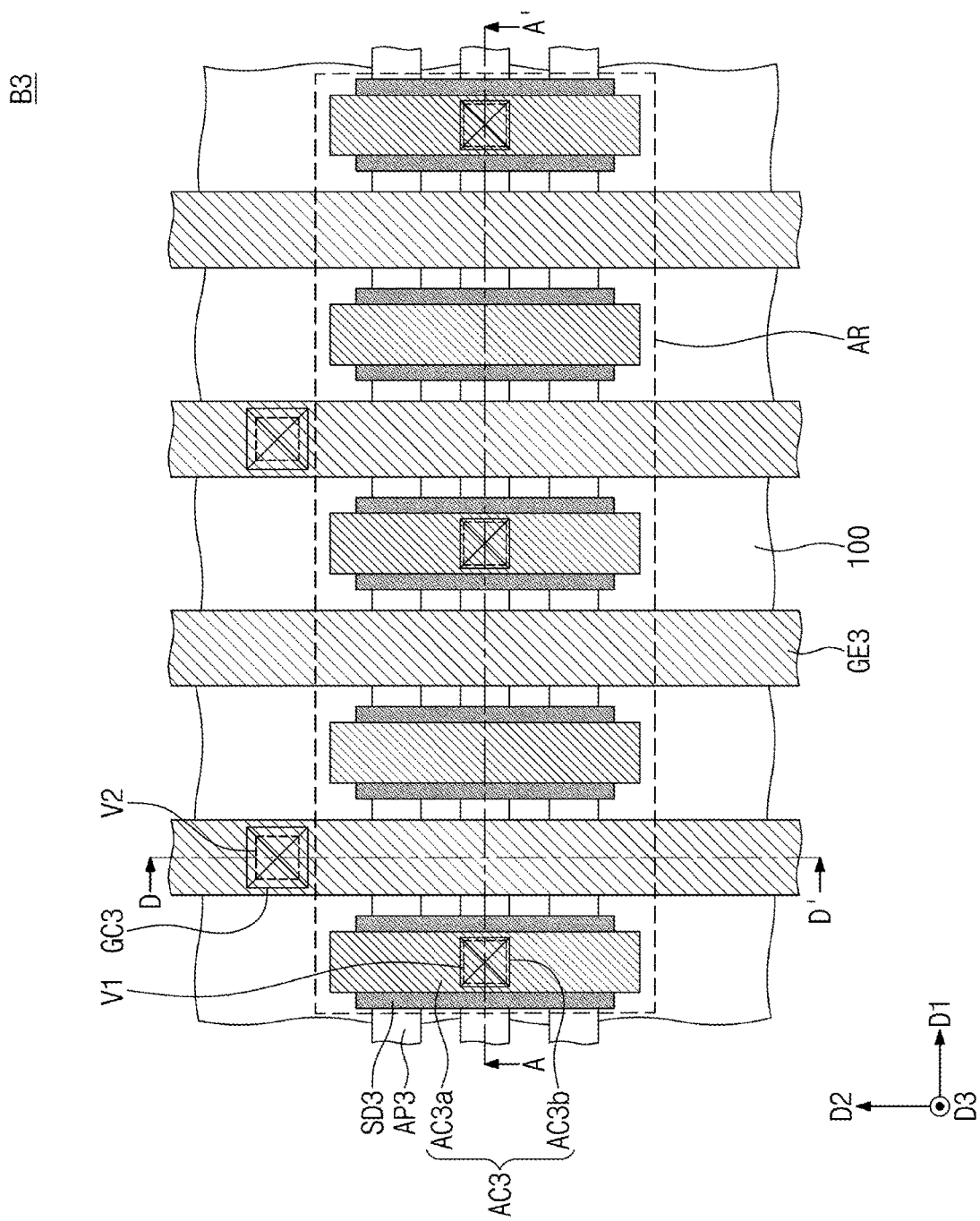
Figure 9B:
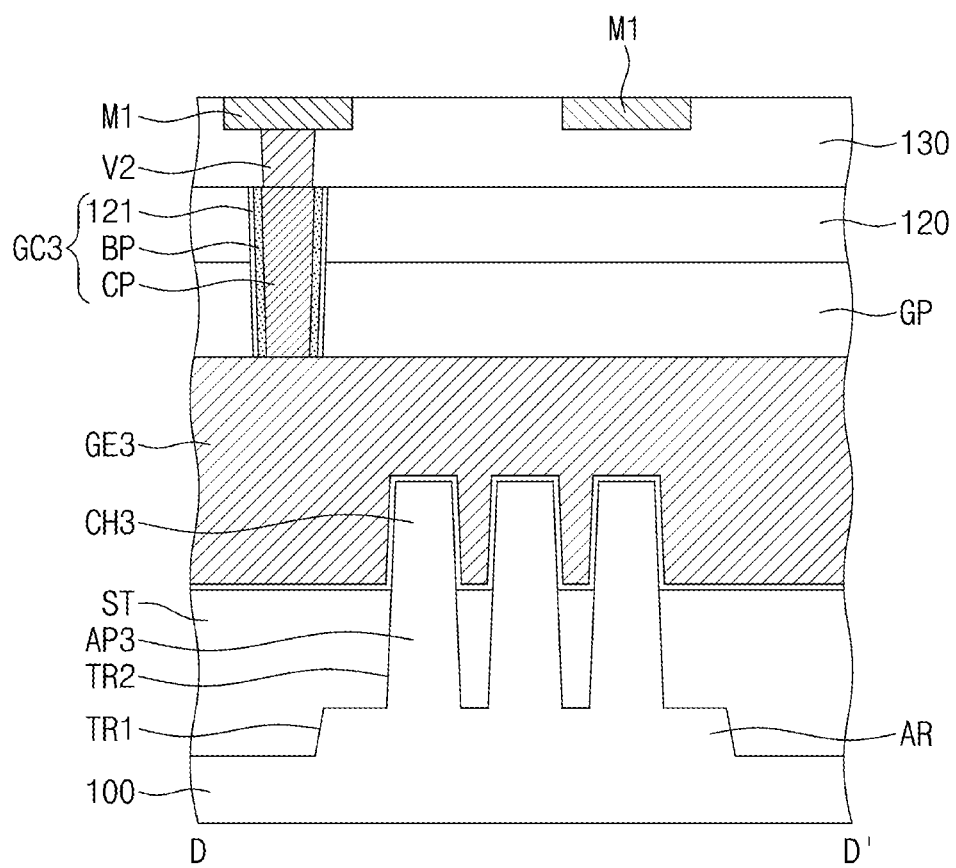
Figure 9B:
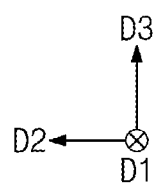

FIG. 8 is a plan view illustrating a test circuit (e.g., the portion B3 of FIG. 3A) of a semiconductor device according to some embodiments of the inventive concept. FIGS. 9A and 9B are sectional views, which are respectively taken along lines A-A' and D-D' of FIG. 8, that illustrate a test circuit of a semiconductor device according to some embodiments of the inventive concept. In the following description, a previously-described element will be identified by the same reference number without repeating an overlapping description thereof, for convenience in description.

Referring to FIGS. 8, 9A, and 9B, third gate electrodes GE3 may be provided on the active region AR to extend in the second direction D2. Unlike the first and second gate electrodes GE1 and GE2 of the first and second test circuits B1 and B2, the third gate electrodes GE3 may extend in the second direction D2, without the separation by the isolation pattern IP, when compared with the structure of FIGS. 4 and 6. Similar to the first and second active contacts AC1 and AC2 of the first and second test circuits B1 and B2, third active contacts AC3 may be provided on the active region AR and may be electrically connected to third source/drain patterns SD3, respectively, and may include a first portion AC3a, whose top surface is recessed toward the semiconductor substrate 100, and a second portion AC3b, whose top surface is coplanar with the top surface of the second interlayer insulating layer 120. Unlike the first and second active contacts AC1 and AC2, the second portion AC3b of the third active contacts AC3 and the third gate electrodes GE3 may be adjacent to each other in the first direction D1.

Referring to FIGS. 3C, 8, and 9A, the third test circuit B3 may be used to measure a leakage current flowing through the first interconnection lines M1 and the first and second vias V1 and V2 connected thereto, similar to the first and second test circuits B1 and B2. In more detail, leakage currents between the first portion AC3*a* of one of the third active contacts AC3 and one of the third gate electrodes GE3 and between the second portion AC3*b* of one of the third active contacts AC3 and one of the third gate electrodes GE3 may be measured by the third test circuit B3. In such embodiments, it may be possible to determine whether a short circuit is formed between elements of the third test circuit B3.

A sum of the leakage currents may be defined as the third leakage current c measured by the third test circuit B3. The third leakage component may be defined as a difference between the third leakage current c and the first leakage current a, which is measured by the first test circuit B1. The third leakage component may be a leakage current between the second portion AC3*b* of the third active contacts AC3 and the third gate electrodes GE3.

Figure 10:
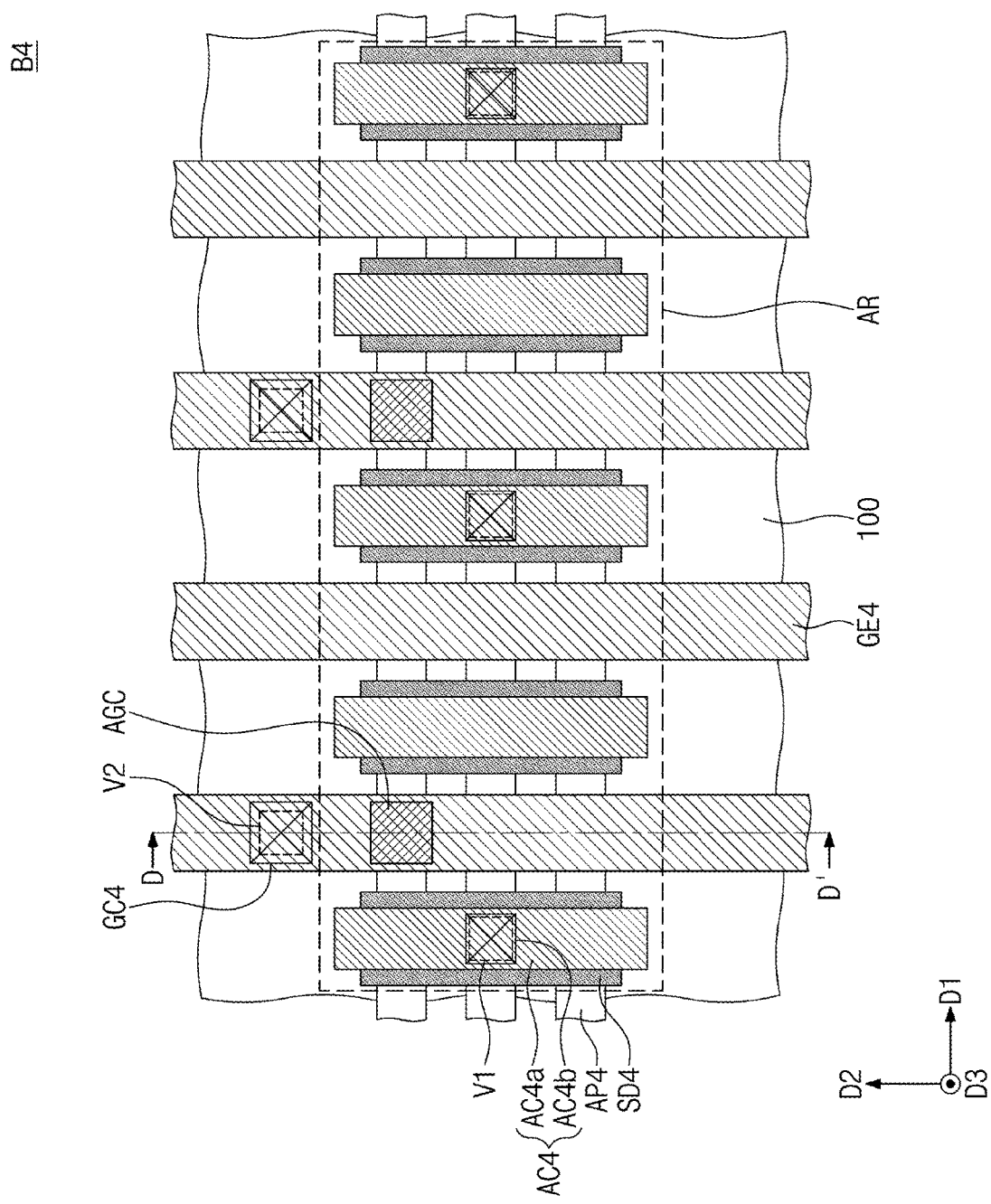
Figure 11:
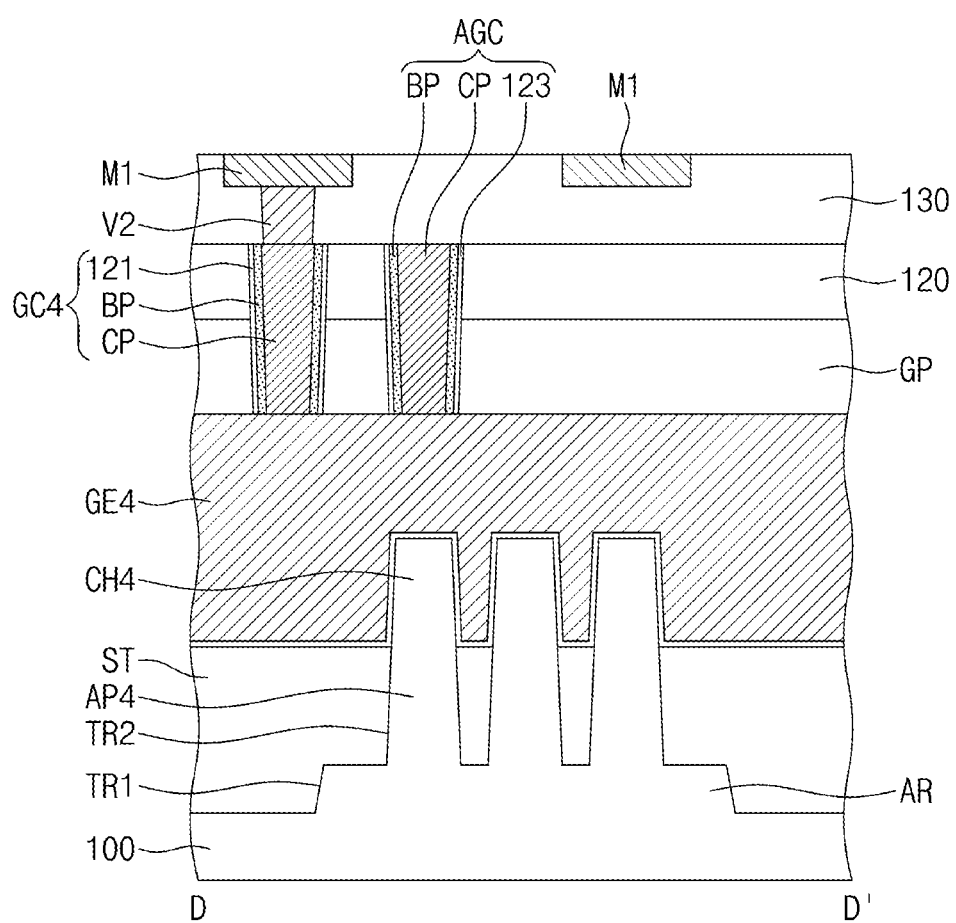
FIG. 11 is a sectional view, which is taken along a line D-D' of FIG. 10, that illustrate a test circuit of a semiconductor device according to some embodiments of the inventive concept.
Figure 11:
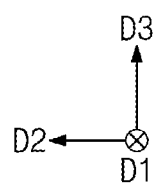

FIG. 10 is a plan view illustrating a test circuit (e.g., the portion B4 of FIG. 3A) of a semiconductor device according to some embodiments of the inventive concept. FIG. 11 is a sectional view, which is taken along a line D-D' of FIG. 10, that illustrates a test circuit of a semiconductor device according to an embodiment of the inventive concept. In the following description, a previously-described element will be identified by the same reference number without repeating an overlapping description thereof, for convenience in description.

Referring to FIGS. 10 and 11, the active gate contacts AGC, which are electrically connected to the third gate electrodes GE3, may be provided to penetrate the second interlayer insulating layer 120 and the gate capping pattern GP, similar to the second test circuit B2 (e.g., see FIG. 6). The active gate contacts AGC may be provided to have substantially the same features as those in the second test circuit B2 (e.g., see FIG. 6). In comparison with the structure of FIG. 6, a distance between one of the active gate contacts AGC and a second portion AC4*b* of a fourth active contact AC4 adjacent thereto may be less than a distance between one of the active gate contacts AGC of FIG. 6 and the second portion AC2*b* of the second active contact AC2 adjacent thereto. A leakage current between the second portion AC4*b* of the fourth active contact AC4 and the active gate contact AGC may be measured by the fourth test circuit B4.

As a result, referring to FIGS. 3C, 10, and 11, leakage currents between a first portion AC4*a* of one of the fourth active contacts AC4 and one of fourth gate electrodes GE4, between the first portion AC4*a* of one of the fourth active contacts AC4 and one of the active gate contacts AGC, between the second portion AC4*b* of one of the fourth active contacts AC4 and one of the fourth gate electrodes GE4, and between the second portion AC4*b* of one of the fourth active contacts AC4 and one of the active gate contacts AGC may be measured by the fourth test circuit B4. In such embodiments, it may be possible to determine whether a short circuit is formed between elements of the fourth test circuit B4.

A sum of the leakage currents may be defined as the fourth leakage current d measured by the fourth test circuit B4. The fourth leakage component may be defined as a difference between a sum of the first and fourth leakage currents a and d and a sum of the second and third leakage currents b and c. The fourth leakage component may be a leakage current between the second portion AC4*b* of the fourth active contacts AC4 and the active gate contacts AGC adjacent thereto.

Figure 12:
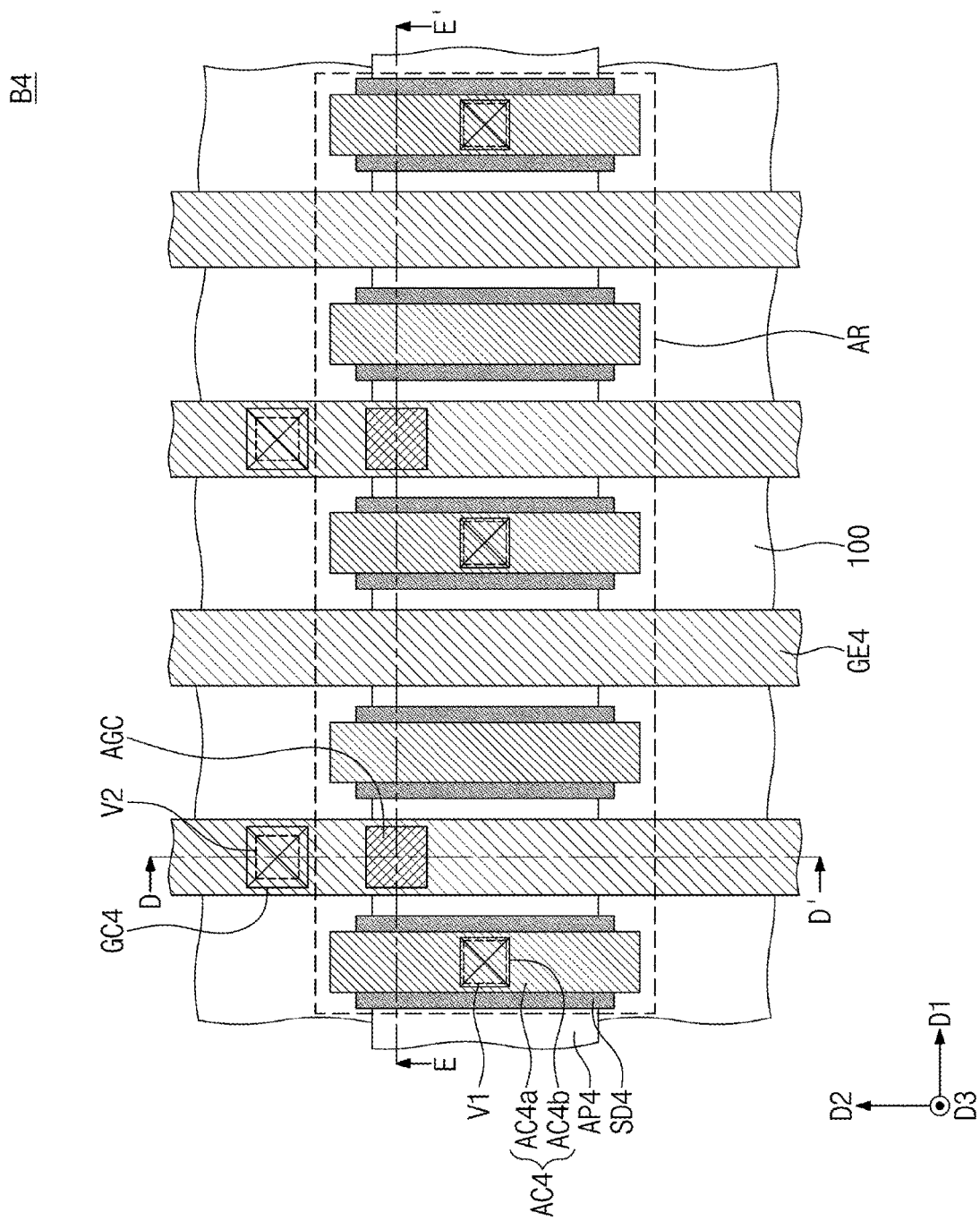
FIG. 12 is a plan view illustrating a test circuit (e.g., the portion B4 of FIG. 3A) of a semiconductor device according to some embodiment s of the inventive concept.
Figure 13A:
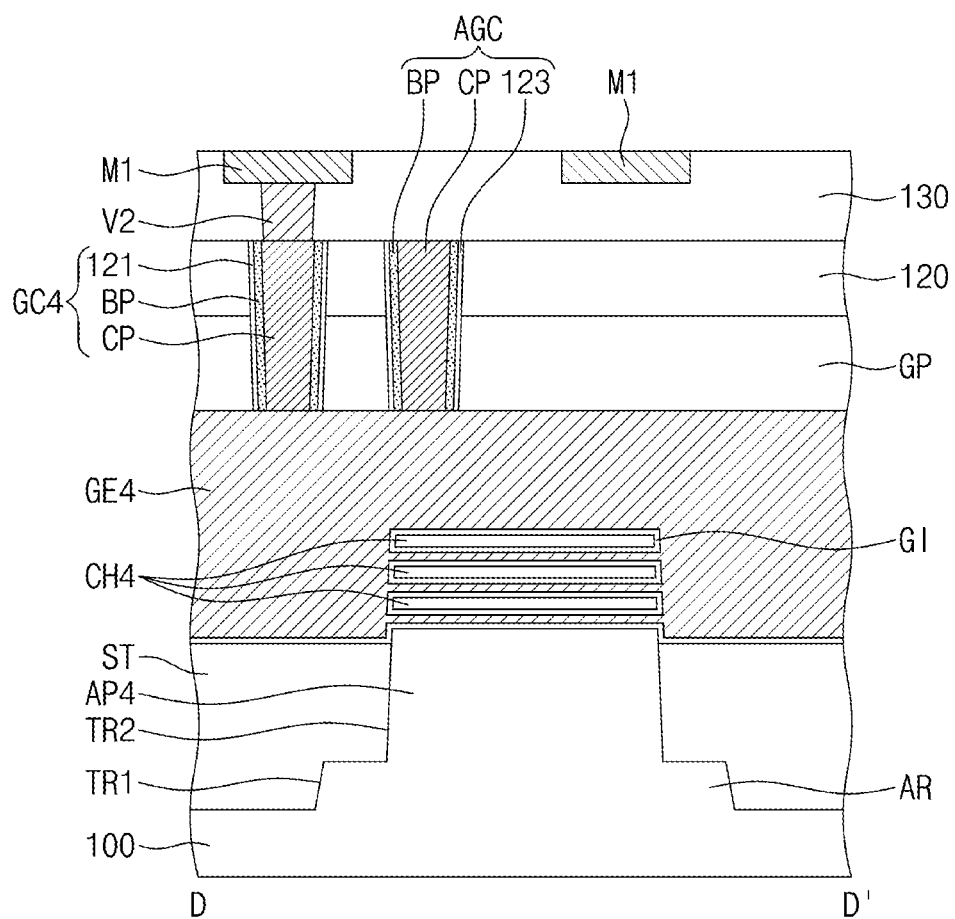
FIGS. 13A and 13B are sectional views, which are respectively taken along lines D-D' and E-E' of FIG. 12, that illustrate a test circuit of a semiconductor device according to some embodiments of the inventive concept.
Figure 13A:
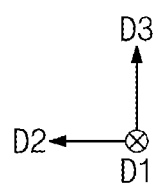
Figure 13B:
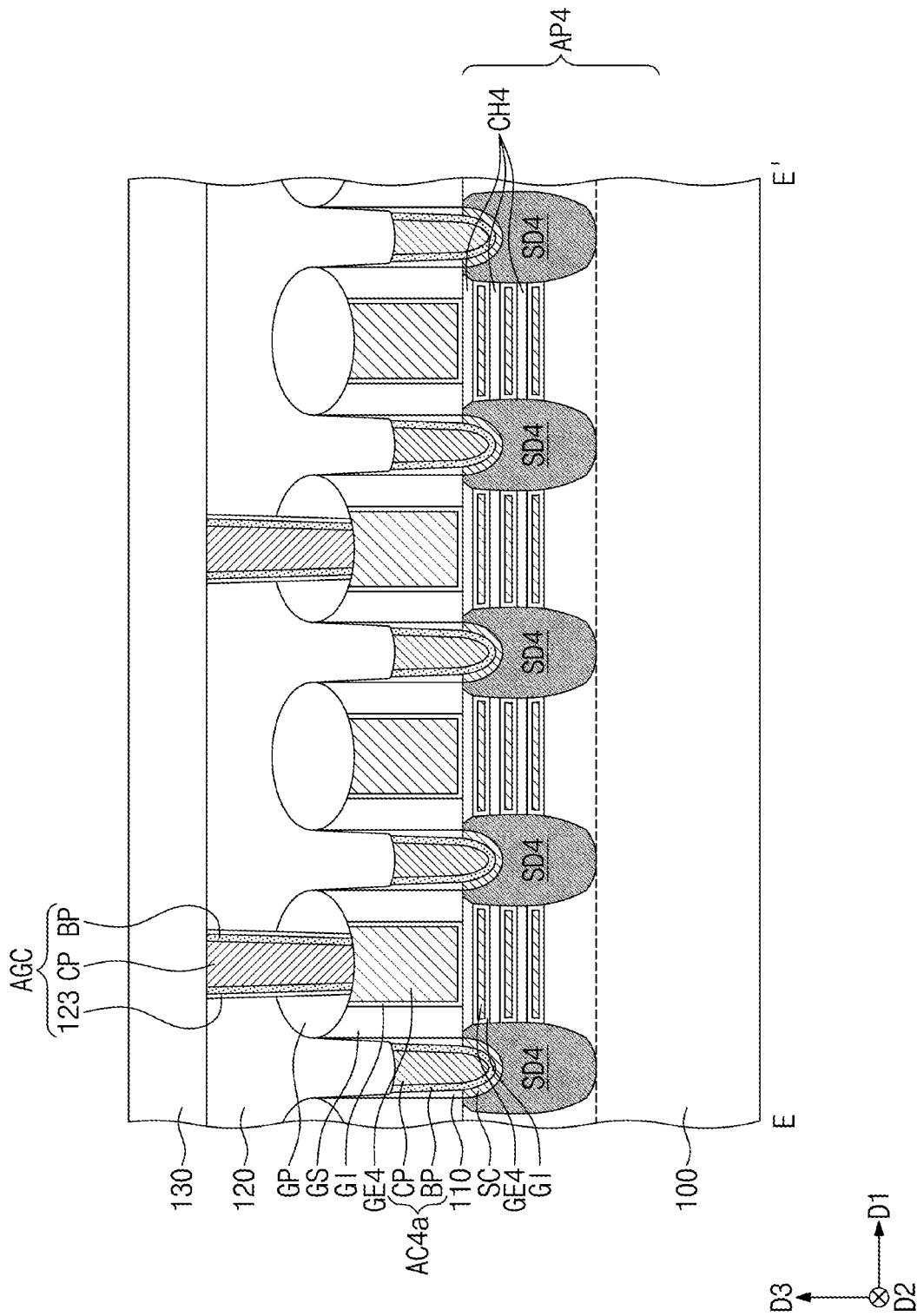

FIG. 12 is a plan view illustrating a test circuit (e.g., the portion B4 of FIG. 3A) of a semiconductor device according to some embodiments of the inventive concept. FIGS. 13A and 13B are sectional views, which are respectively taken along lines D-D' and E-E' of FIG. 12, that illustrate a test circuit of a semiconductor device according to an embodiment of the inventive concept. In the following description, a previously-described element will be identified by the same reference number without repeating an overlapping description thereof, for convenience in description.

Referring to FIGS. 12, 13A, and 13B, the semiconductor substrate 100 including the active region AR may be provided. The device isolation layer ST may be provided in an upper portion of the semiconductor substrate 100. The device isolation layer ST may define a fourth active pattern AP4 in the upper portion of the semiconductor substrate 100. The fourth active pattern AP4 may be provided on the active region AR.

The fourth active pattern AP4 may include fourth channel patterns CH4, which are stacked in the third direction D3. The fourth channel patterns CH4, which are stacked, may be spaced apart from each other in the third direction D3. The fourth channel patterns CH4, which are stacked, may overlap each other in the third direction D3. The fourth channel patterns CH4 may be formed of or include silicon, germanium, or silicon-germanium or combinations thereof.

The fourth active pattern AP4 may further include fourth source/drain patterns SD4. The fourth channel patterns CH4, which are stacked, may be interposed between an adjacent pair of the fourth source/drain patterns SD4. The fourth channel patterns CH4, which are stacked, may connect the adjacent pair of the fourth source/drain patterns SD4 to each other.

The fourth gate electrodes GE4 may be provided to cross the fourth channel patterns CH4 and to extend in the second direction D2. The fourth gate electrodes GE4 may overlap the fourth channel patterns CH4 in the third direction D3. The fourth gate electrodes GE4 may border or surround the fourth channel patterns CH4. In detail, the fourth gate electrodes GE4 may be provided to border or surround top, bottom, and side surfaces of the fourth channel patterns CH4. Accordingly, each of the fourth gate electrodes GE4 may serve as a gate electrode of a gate-all-around (GAA)-type field effect transistor.

Furthermore, the gate dielectric pattern GI may be provided between the fourth channel patterns CH4 and the fourth gate electrodes GE4. The gate dielectric pattern GI may be provided to border or surround each of the fourth channel patterns CH4.

In a method of testing a semiconductor device according to some embodiments of the inventive concept, different test circuits are used to respectively calculate leakage components, which are produced by different causes.

While example embodiments of the inventive concept have been particularly shown and described, it will be understood by one of ordinary skill in the art that variations in form and detail may be made therein without departing from the spirit and scope of the attached claims.

What is claimed is:
1. A method of testing a semiconductor device, comprising:

preparing a semiconductor substrate, the semiconductor substrate comprising a test element group including a first test circuit and a second test circuit, which are different from each other;
measuring first and second leakage currents in the first and second test circuits, respectively; and
calculating leakage components by comparing the first and second leakage currents,
wherein each of the first and second test circuits comprises an active region, which is an upper portion of the semiconductor substrate, a gate electrode, which is configured to cross the active region and to extend in a first direction, and an active contact, which is on the active region, is spaced apart from the gate electrode, and extends in the first direction, and
wherein the second test circuit further comprises a first gate contact, which is connected to the gate electrode and overlaps the active region in a direction perpendicular to the semiconductor substrate.

2. The method of claim 1, wherein the calculating of the leakage components comprises:
defining the first leakage current as a first leakage component; and
calculating a second leakage component as a difference between the first leakage current and the second leakage current,
wherein the first leakage component is a leakage component between the gate electrode and the active contact, and
wherein the second leakage component is a leakage component between the first gate contact and the active contact.

3. The method of claim 2, wherein each of the first and second test circuits further comprises a second gate contact, which is connected to the gate electrode and is spaced apart from the active region, and
wherein each of the first and second leakage currents is measured through the active contact and the second gate contact.

4. The method of claim 3, wherein the active contact comprises a first portion, whose top surface is located at a level lower than a top surface of the gate electrode in a cross-sectional view of the semiconductor device with the semiconductor substrate serving as a base reference plane, and a second portion, whose top surface is located at a level higher than the top surface of the gate electrode in the cross-sectional view of the semiconductor device with the semiconductor substrate serving as the base reference plane, and
each of the first and second leakage currents is measured through the second portion of the active contact and the second gate contact.

5. The method of claim 4, wherein, in each of the first and second test circuits, the gate electrode comprises a first electrode, which is connected to the second gate contact, and a second electrode, which is spaced apart from the first electrode in the first direction.

6. The method of claim 5, wherein each of the first and second test circuits further comprises an isolation pattern between the first electrode and the second electrode, and
wherein the isolation pattern and the second portion of the active contact are adjacent to each other in a second direction perpendicular to the first direction.

7. The method of claim 6, wherein at least a portion of the first electrode of the gate electrode and the first portion of the active contact are adjacent to each other in the second direction.

8. The method of claim 4, wherein the first leakage component is a leakage component between the gate electrode and the first portion of the active contact, and
wherein the second leakage component is a leakage component between the first gate contact and the first portion of the active contact.

9. The method of claim 4, between the preparing of the semiconductor substrate and the measuring of the first and second leakage currents, the method further comprising:
forming first and second vias, which are respectively connected to the second portion of the active contact and the second gate contact; and
forming a first interconnection line connected to the first and second vias.

10. The method of claim 9, wherein the method further comprises determining whether a short circuit is formed between the gate electrode and the first portion of the active contact or whether a short circuit is formed between the first gate contact and the first portion of the active contact by the measuring using the first interconnection line.

11. The method of claim 4, wherein the test element group further comprises third and fourth test circuits,
wherein each of the third and fourth test circuits comprises the gate electrode, the active contact, and the second gate contact,
wherein the fourth test circuit further comprises the first gate contact, and
wherein in the third and fourth test circuits, the gate electrode and the second portion of the active contact are adjacent to each other in a second direction perpendicular to the first direction.

12. The method of claim 11, further comprising:
measuring third and fourth leakage currents in the third and fourth test circuits, respectively; and
calculating a third leakage component as a difference between the first leakage current and the third leakage current; and
calculating a fourth leakage component as a difference between a sum of the first and fourth leakage currents and a sum of the second and third leakage currents,
wherein the third leakage component is a leakage component between the second portion of the active contact and the gate electrode, and
wherein the fourth leakage component is a leakage component between the second portion of the active contact and the first gate contact.

13. The method of claim 1, wherein the semiconductor substrate further comprises chip regions, on which semiconductor integrated circuits are formed, and a scribe line region between the chip regions, and
wherein the test element group is provided on the scribe line region.

14. A method of testing a semiconductor device, comprising:
preparing a semiconductor substrate, the semiconductor substrate comprising a test element group including a first test circuit and a second test circuit, which are different from each other;
measuring first and second leakage currents in the first and second test circuits, respectively; and
calculating first and second leakage components by comparing the first and second leakage currents,
wherein each of the first and second test circuits comprises an active region, which is an upper portion of the semiconductor substrate, a gate electrode, which is configured to cross the active region and to extend in a first direction, and an active contact, which is on the active region, is spaced apart from the gate electrode, and extends in the first direction, and wherein the second test circuit further comprises a first gate contact, which is connected to the gate electrode and overlaps the active region in a vertical direction perpendicular to the semiconductor substrate, wherein the active region comprises a plurality of source/drain patterns and a plurality of channel patterns, and wherein the gate electrode at least partially surrounds the channel patterns.

15. The method of claim 14, wherein the channel patterns are spaced apart from each other in the vertical direction, and each of the channel patterns connects adjacent ones of the source/drain patterns.

16. The method of claim 14, further comprising a gate dielectric pattern between the gate electrode and the channel patterns.

17. The method of claim 16, between the preparing of the semiconductor substrate and the measuring of the first and second leakage currents, the method further comprising:
    forming first and second vias, which are respectively connected to a portion of the active contact and the second gate contact; and
    forming a first interconnection line connected to the first and second vias.

18. The method of claim 14, wherein, in the first and second test circuits, the gate electrode comprises a first electrode and a second electrode, which are electrically disconnected from each other, and
    wherein the first gate contact is on the first electrode.

19. A method of testing a semiconductor device, comprising
    preparing a semiconductor substrate, the semiconductor substrate comprising a test element group including a first test circuit and a second test circuit, which are different from each other;

measuring first and second leakage currents in the first and second test circuits, respectively; and calculating first and second leakage components by comparing the first and second leakage currents, wherein each of the first and second test circuits comprises an active region, which is an upper portion of the semiconductor substrate, a gate electrode, which is configured to cross the active region and to extend in a first direction, an active contact, which is spaced apart from the gate electrode and extends in the first direction, and a first gate contact, which is connected to the gate electrode and is spaced apart from the active region, wherein the second test circuit further comprises a second gate contact, which is on the gate electrode and overlaps the active region in a vertical direction perpendicular to the semiconductor substrate, wherein the semiconductor substrate further comprises a plurality of active patterns protruding from the active region in the vertical direction, and wherein the gate electrode is on top surfaces of the active patterns and at least a portion of side surfaces of the active patterns.

20. The method of claim 19, further comprising:
    a device isolation layer in a space between the active patterns; and
    a gate dielectric pattern between the active patterns and the gate electrode, the gate dielectric pattern being conformally arranged on the top surfaces of the active patterns and at least a portion of the side surfaces of the active patterns,
    wherein the gate dielectric pattern extends along a top surface of the device isolation layer.

* * * * *